(12) United States Patent
Xie et al.

(10) Patent No.: US 12,538,786 B2
(45) Date of Patent: Jan. 27, 2026

(54) BACKSIDE CONTACT FOR SEMICONDUCTOR DEVICE

(71) Applicant: International Business Machines Corporation, Armonk, NY (US)

(72) Inventors: Ruilong Xie, Niskayuna, NY (US); Tsung-Sheng Kang, Ballston Lake, NY (US); Daniel Schmidt, Niskayuna, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 632 days.

(21) Appl. No.: 17/889,357

(22) Filed: Aug. 16, 2022

(65) Prior Publication Data

US 2024/0063121 A1 Feb. 22, 2024

(51) Int. Cl.
*H01L 21/00* (2006.01)
*H01L 23/52* (2006.01)
*H01L 23/522* (2006.01)
*H01L 23/528* (2006.01)

(52) U.S. Cl.
CPC ...... *H01L 23/5286* (2013.01); *H01L 23/5226* (2013.01); *H01L 23/5283* (2013.01)

(58) Field of Classification Search
None
See application file for complete search history.

(56) References Cited

U.S. PATENT DOCUMENTS

| | | | |
|---|---|---|---|
| 10,079,230 B2 | 9/2018 | Stuber | |
| 2019/0157310 A1 | 5/2019 | Glass | |
| 2019/0371890 A1* | 12/2019 | Goktepeli | H10D 86/201 |
| 2020/0219997 A1 | 7/2020 | Mehandru | |
| 2020/0294860 A1* | 9/2020 | Chang | H01L 21/76895 |
| 2020/0303509 A1 | 9/2020 | Mehandru | |
| 2021/0111115 A1 | 4/2021 | Patrick | |
| 2021/0134721 A1 | 5/2021 | Chiang et al. | |
| 2021/0202385 A1 | 7/2021 | Huang et al. | |
| 2021/0305252 A1 | 9/2021 | Chiang et al. | |
| 2021/0305381 A1 | 9/2021 | Chiang et al. | |
| 2021/0336020 A1 | 10/2021 | Yu | |
| 2021/0343645 A1* | 11/2021 | Peng | H10D 84/0149 |
| 2021/0351303 A1 | 11/2021 | Ju et al. | |

(Continued)

FOREIGN PATENT DOCUMENTS

TW 202101706 A 1/2021

OTHER PUBLICATIONS

Authorized Officer Kostrzewa, Marek. European Patent Office. PCT/EP2023/071335 ISR & WO on Nov. 7, 2023. pp. 16 counterpart PCT application.

(Continued)

*Primary Examiner* — Nicholas J Tobergte
(74) *Attorney, Agent, or Firm* — Seed Intellectual Property Law Group LLP

(57) ABSTRACT

Backside contacts wrapping around source/drain regions provide increased contact areas for electrical connections between field-effect transistors and metallization layers. Cavities formed within a device layer expose sidewalls of selected source/drain regions. The backside contacts extend within such cavities and adjoin the sidewall surfaces and bottom surfaces of the selected source/drain regions.

20 Claims, 17 Drawing Sheets

(56) References Cited

U.S. PATENT DOCUMENTS

| | | |
|---|---|---|
| 2021/0376071 A1 | 12/2021 | Liu et al. |
| 2021/0376093 A1 | 12/2021 | Chu et al. |
| 2021/0376155 A1 | 12/2021 | Chang et al. |
| 2021/0399099 A1 | 12/2021 | Chu |
| 2021/0399109 A1 | 12/2021 | Su et al. |
| 2021/0408249 A1 | 12/2021 | Yu |
| 2022/0069117 A1 | 3/2022 | Yu et al. |
| 2022/0093512 A1 | 3/2022 | Chang |
| 2022/0102274 A1 | 3/2022 | Chien |
| 2023/0187551 A1* | 6/2023 | Cheng ............... H10D 30/6757 257/369 |

OTHER PUBLICATIONS

Taiwan Intellectual Property Office. Examiner's Decision. Related Patent Application # 11320644800, Jun. 27, 2024. pp. 6.

Taiwan ROC Office Action, counterpart application No. TW112115936 dated Apr. 17, 2024, in simplified Chinese, 12 pages, believe significance can be appreciated by referring to categories of references (X, Y, A) in table on p. 11, US English equivalent 20200303509 of TW202101706A cited herewith other references previously cited.

* cited by examiner

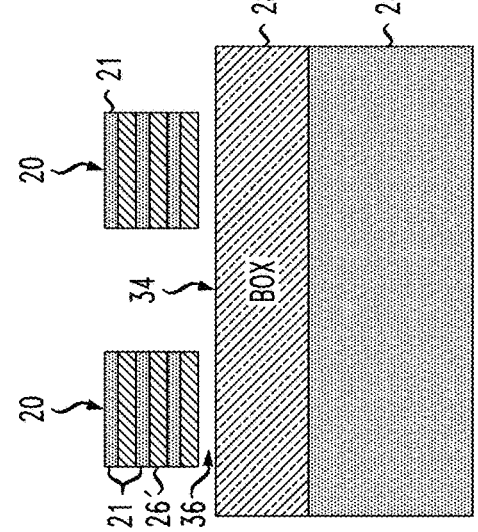
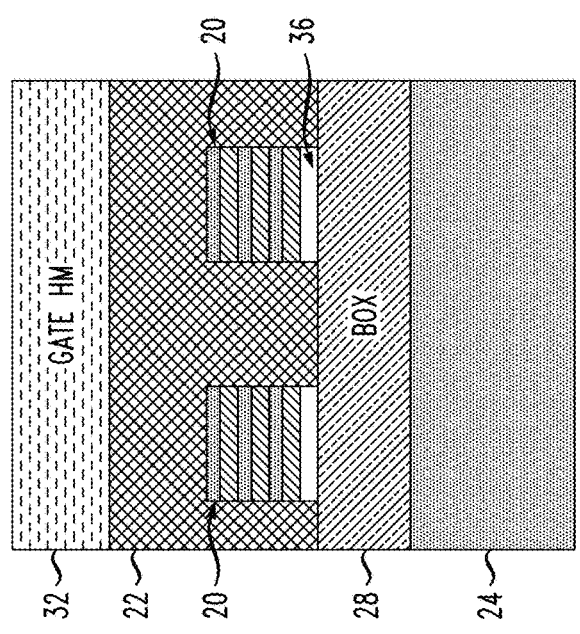
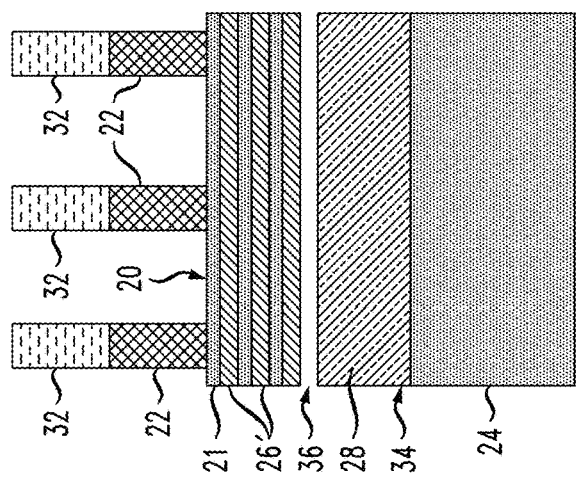

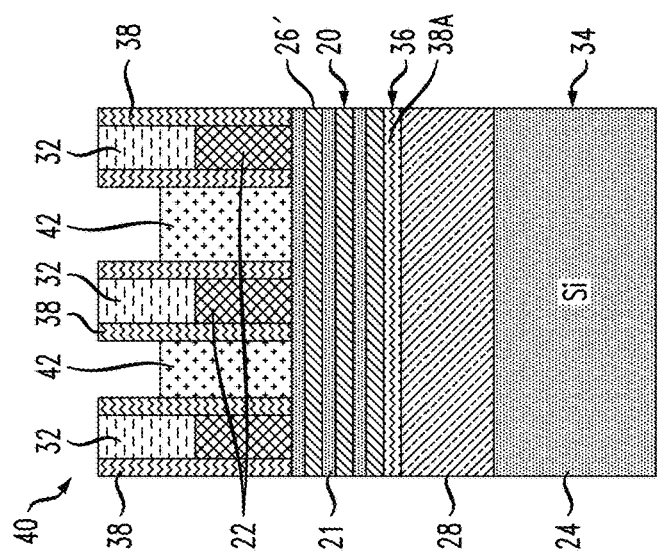
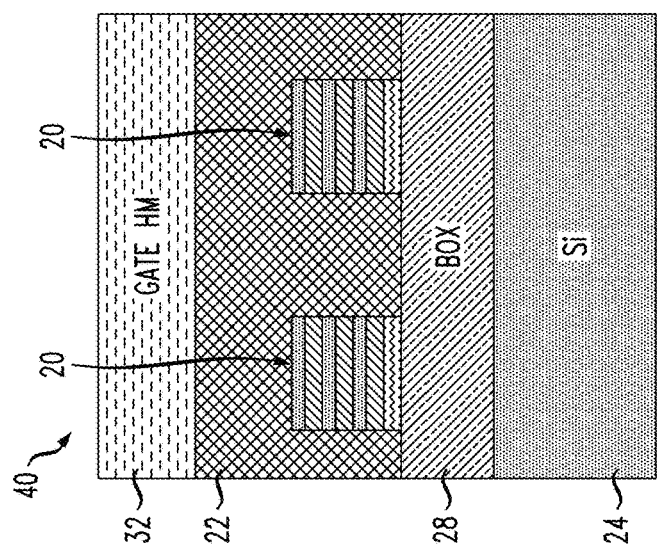
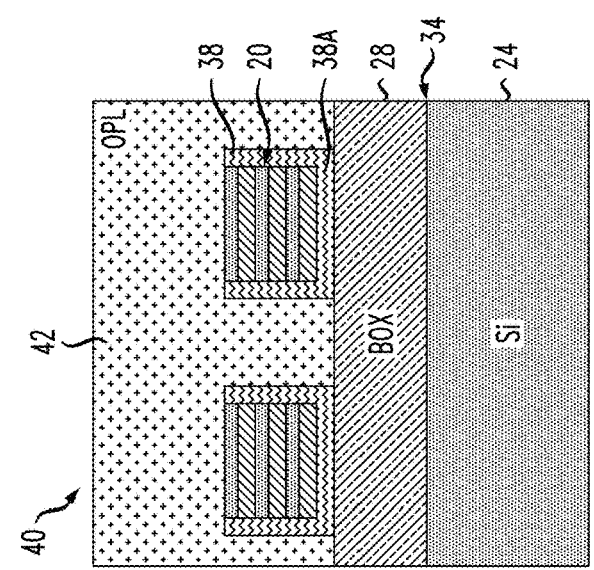

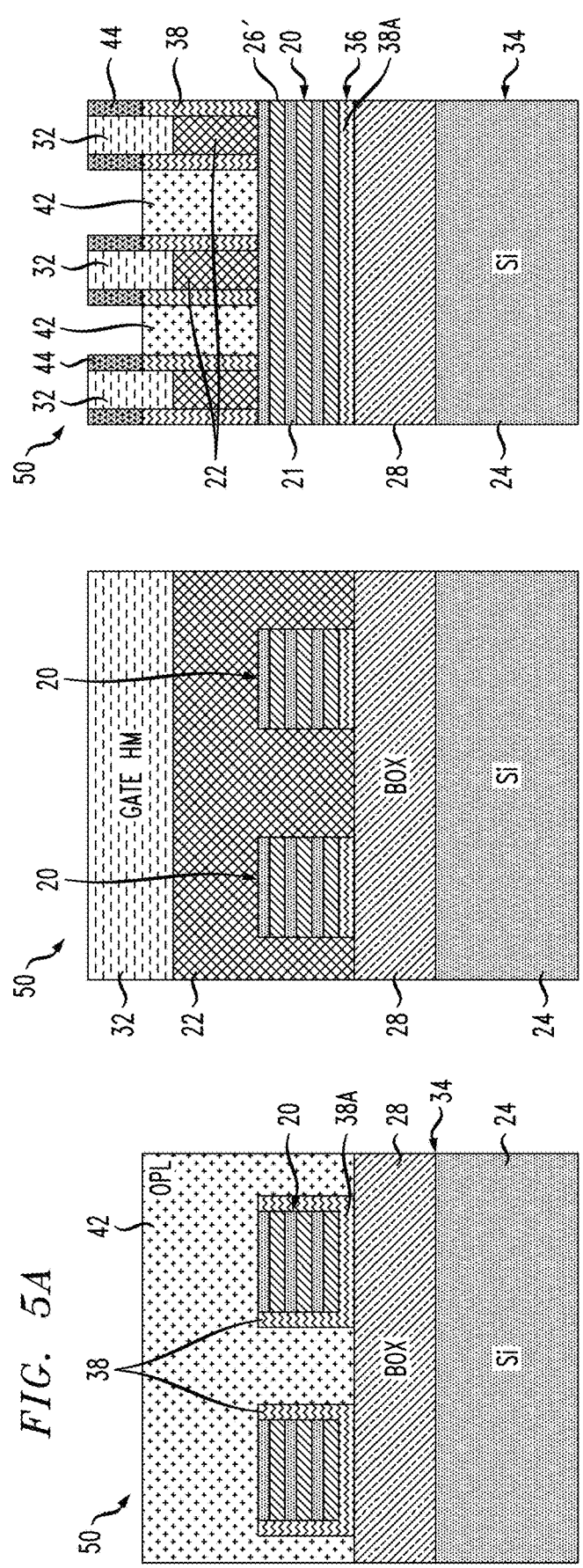

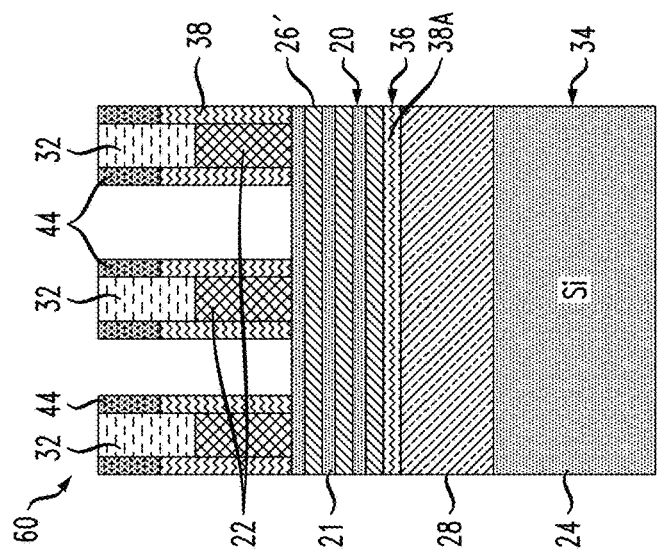
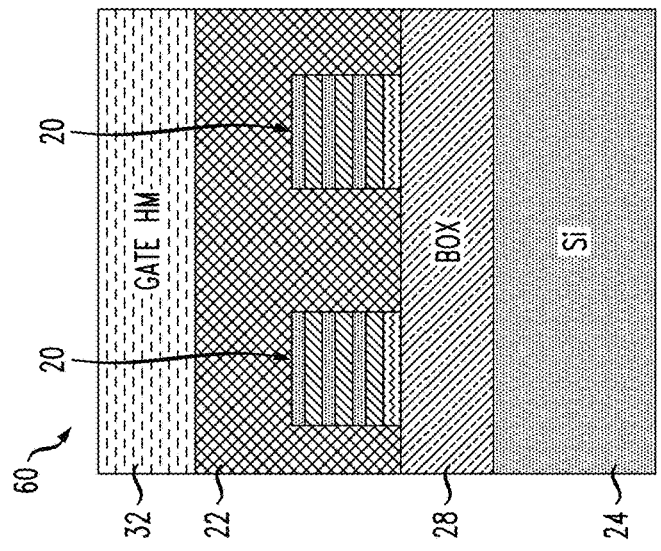
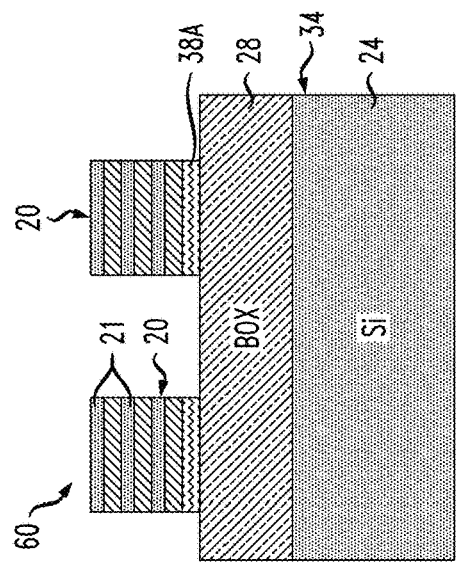

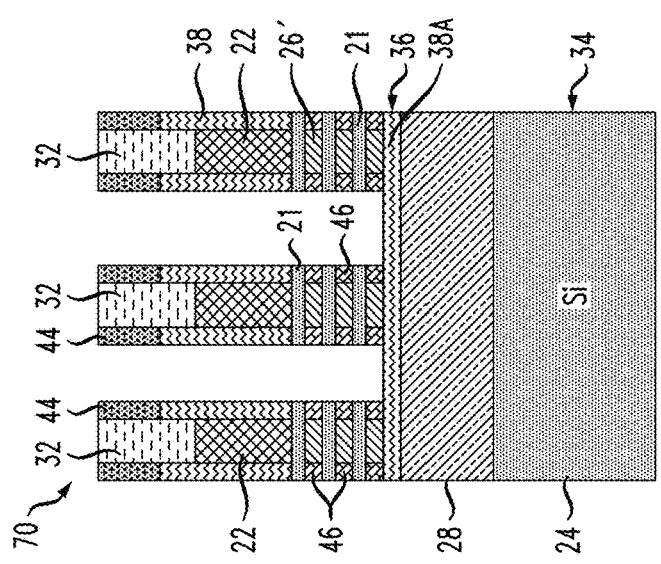
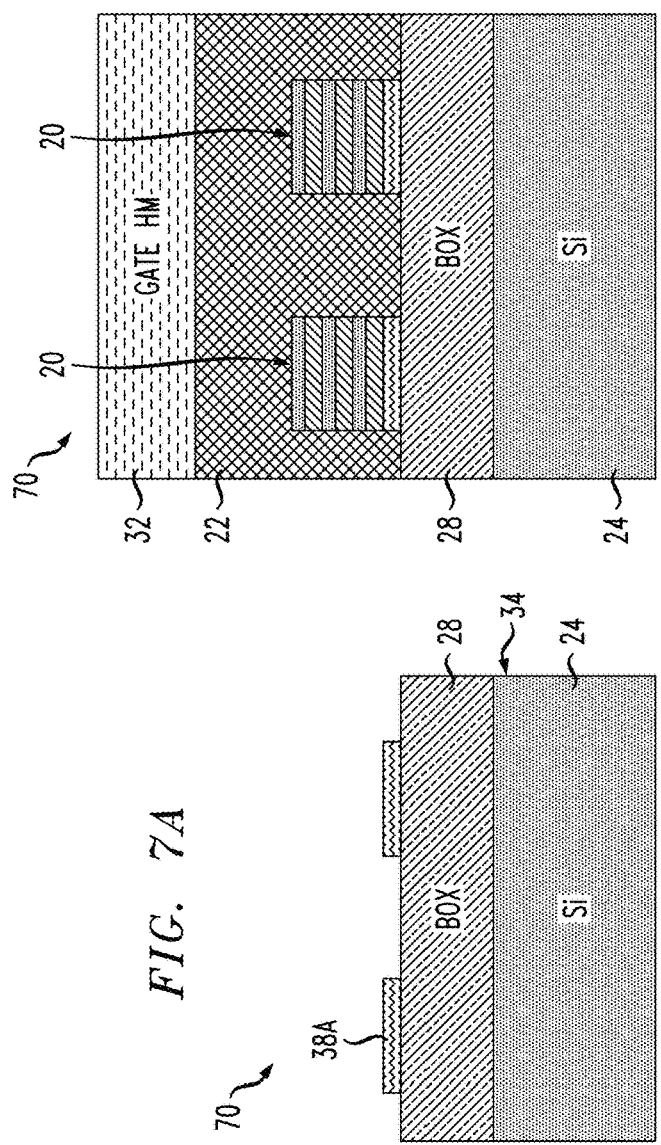

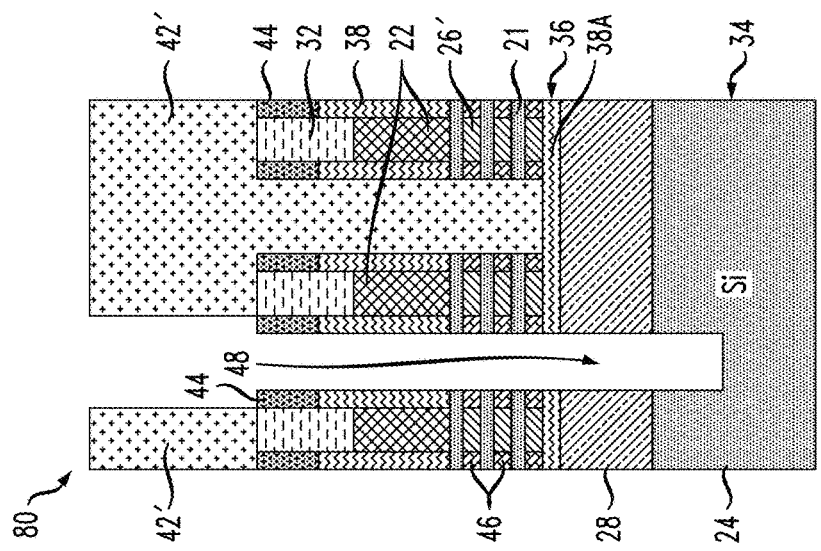
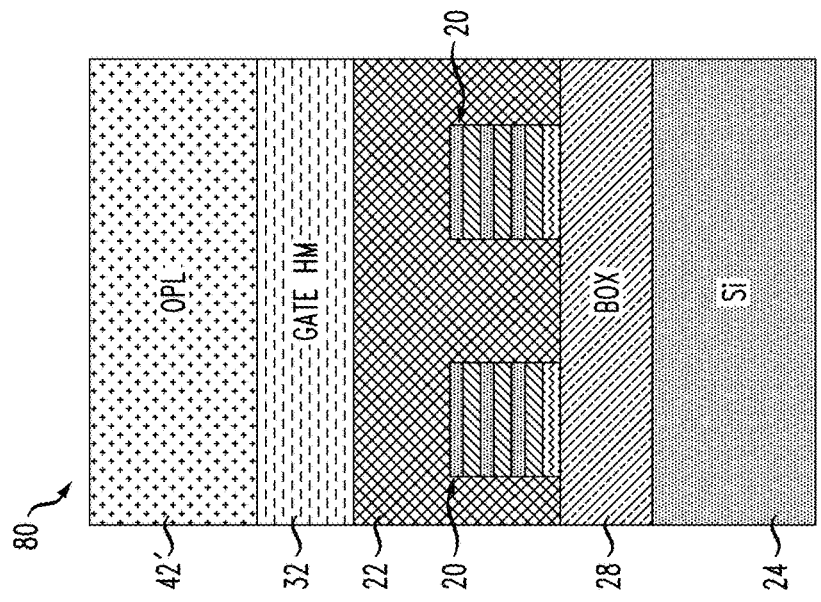
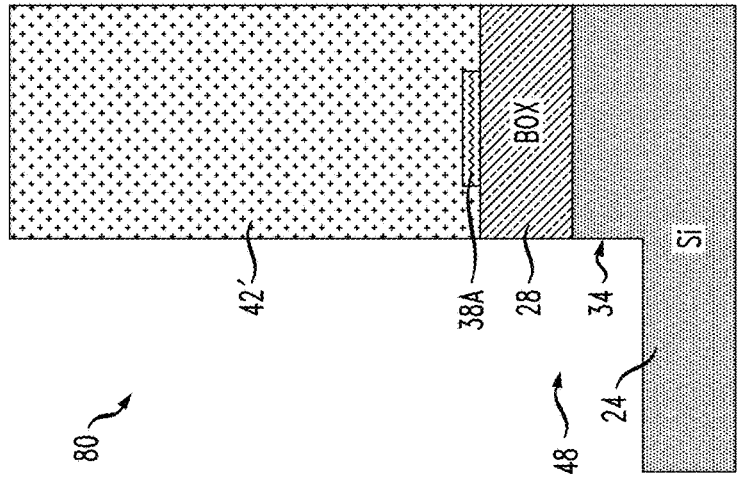

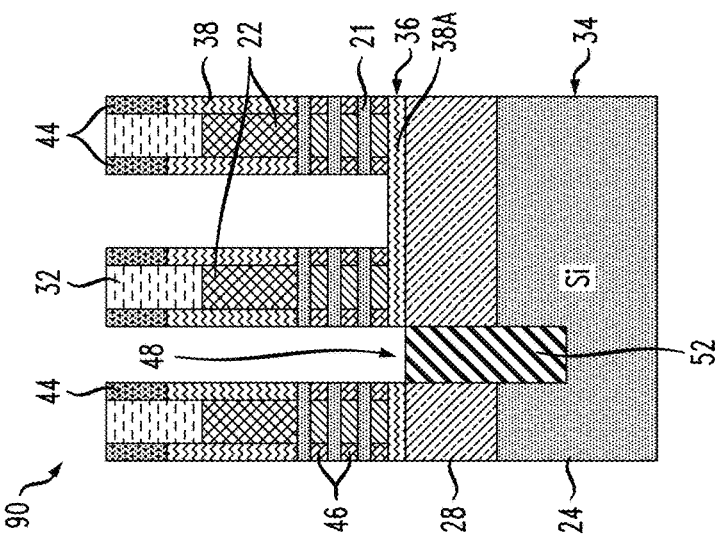
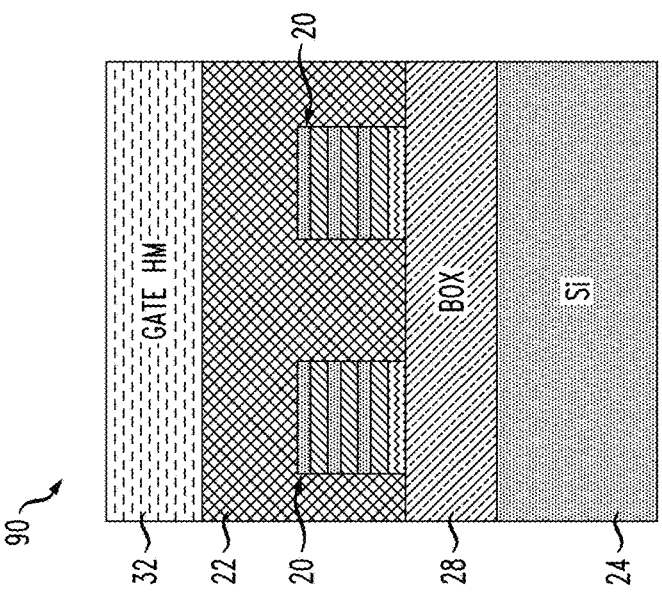
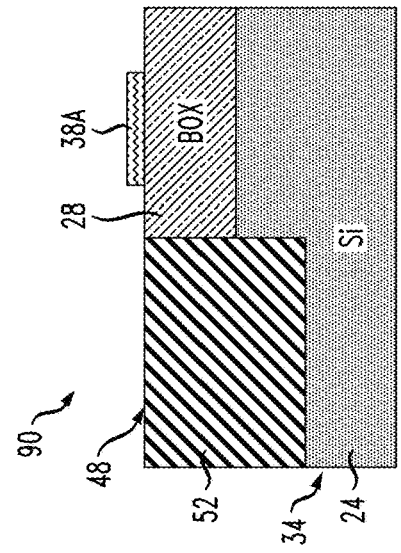
FIG. 9C
FIG. 9B
FIG. 9A

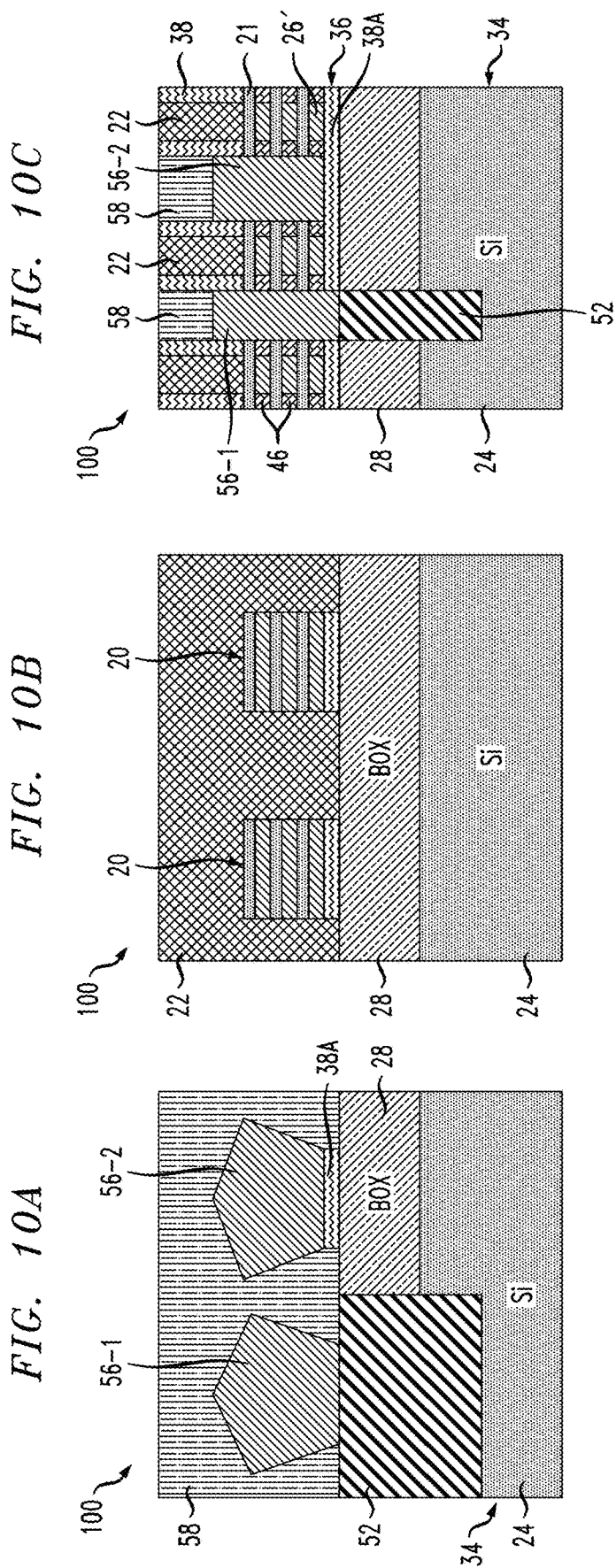

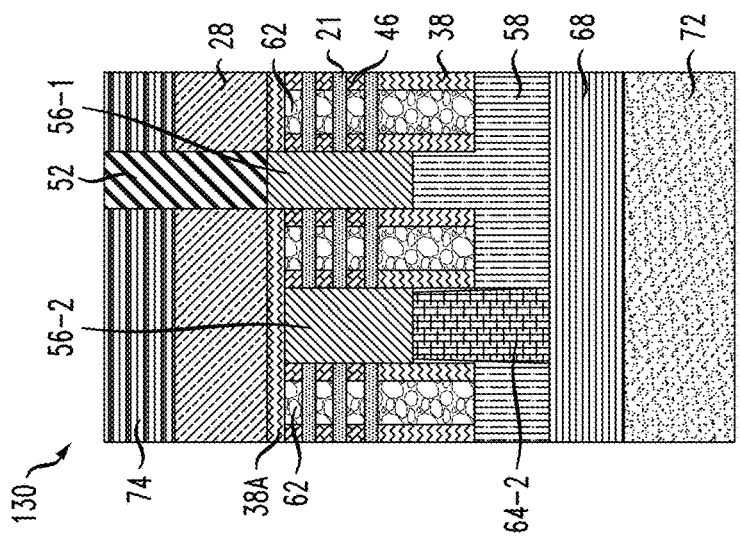
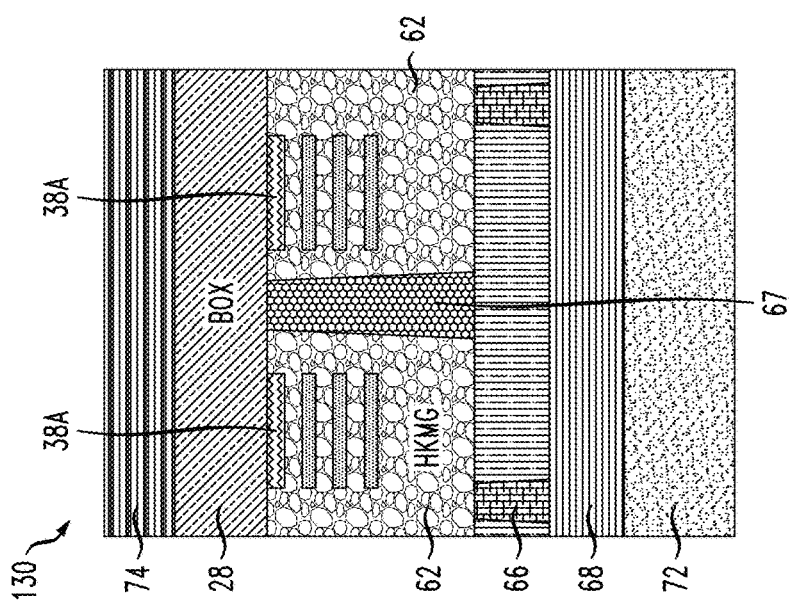
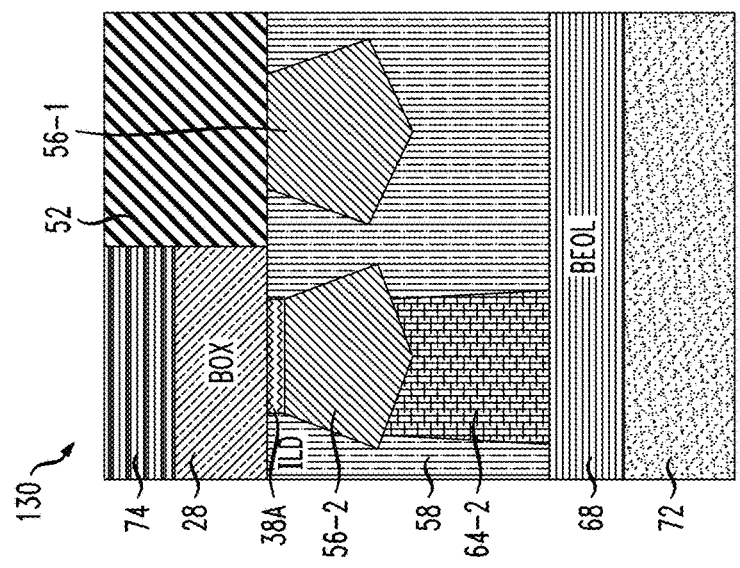

BACKSIDE CONTACT FOR SEMICONDUCTOR DEVICE

BACKGROUND

The present invention relates generally to the electrical, electronic and computer arts and, more particularly, to FET architectures having backside contacts and methods for forming such backside contacts.

With shrinking dimensions of various integrated circuit components, transistors such as field-effect transistors (FETs) have experienced dramatic improvements in both performance and power consumption. These improvements may be largely attributed to the reduction in dimensions of components used therein, which in general translate into reduced capacitance, resistance, and increased through-put current from the transistors. Metal oxide semiconductor field-effect transistors (MOSFETs) are well suited for use in high-density integrated circuits. As the size of MOSFETs and other devices decreases, the dimensions of source/drain regions, channel regions, and gate electrodes of the devices, also decrease.

FinFET, nanosheet and vertical transport FETs have been under development for possible use in tight pitch applications. Nanosheet FETs include multiple channel layers, each channel layer being separated by a gate stack including a layer of electrically conductive gate material and a gate dielectric layer. The gate stacks wrap around all sides of the channel layers, thereby forming a gate-all-around (GAA) structure. Epitaxial regions on the ends of the nanosheet channel layers form source/drain regions of the nanosheet FETs.

The use of both front side contacts and backside contacts can facilitate the fabrication and performance of integrated circuits. By providing contacts on both sides of a chip, contact spacing can be greater than if only one side (for example, the front side) includes all contacts for the FETs. Backside power rails can be electrically connected to backside source/drain contacts.

BRIEF SUMMARY

A monolithic semiconductor structure in accordance with one aspect of the invention includes a device layer having a front side and a back side, an interlevel dielectric layer, and a field-effect transistor. The field-effect transistor includes a channel region and first and second source/drain regions within the interlevel dielectric layer and extending laterally from the channel region. A back-end-of-line layer over the front side of the device layer is electrically connected to the field-effect transistor. A backside contact having a greater width than a bottom surface of the first source/drain region extends from the back side of the device layer. The backside contact is electrically connected to the first source/drain region and contacts first and second sidewall surfaces of the first source/drain region.

A second monolithic semiconductor structure includes a device layer including a front side and a back side. The device layer includes an nFET region including nFET transistors, a pFET region including pFET transistors, and an interlevel dielectric layer. The nFET transistors and the pFET transistors are positioned within the interlevel dielectric layer. A back-end-of-line layer over the front side of the device layer is electrically connected to one or more of the nFET transistors and the pFET transistors. One or more backside contacts extend from the back side of the device layer. Each of the one or more backside contacts is electrically connected, respectively, to a first source/drain region of one of the nFET transistors and the pFET transistors. Each of the one or more backside contacts has a greater width than a bottom surface of the first source/drain region and contacts first and second sidewall surfaces of the first source/drain region.

A method of fabricating a semiconductor structure including a backside contact includes forming a sacrificial placeholder within a substrate, forming a device layer having a front side and a back side over the substrate, the device layer including an interlevel dielectric layer, a semiconductor channel region, and first and second source/drain regions within the interlevel dielectric layer and extending laterally from the channel region. The first source/drain region and portions of the interlevel dielectric layer adjoining the first source/drain region are formed directly above the sacrificial placeholder. The method further includes forming a back-end-of-line interconnect layer over the front side of the device layer, removing the sacrificial placeholder, thereby exposing a bottom surface of the first source/drain region and the portions of the interlevel dielectric layer adjoining the first source/drain region, forming recesses in the interlevel dielectric layer, thereby exposing a first sidewall and a second sidewall of the first source/drain region, and forming a backside contact over the bottom surface, the first sidewall, and the second sidewall of the first source/drain region and extending from the back side of the device layer.

Techniques and structures as disclosed herein can provide substantial beneficial technical effects. By way of example only and without limitation, one or more embodiments may provide one or more of the following advantages:
  Manufacturing flexibility;
  Benefits of backside power delivery network technology;
  Increased backside contact area;
  Wrap-around backside contact.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIG. 2A is a schematic, cross-sectional view along the y-1 cross section showing the structure depicted in FIG. 1A following removal of a bottom layer of the nanosheet stacks;

FIG. 2B is a schematic, cross-sectional view thereof taken along the y-2 cross section;

FIG. 2C is a schematic, cross-sectional view thereof taken along the x cross section;

FIG. 4A is a schematic, cross-sectional view of the structure shown in FIG. 3A following deposition and recessing of an organic planarization layer;

FIG. 4B is a schematic, cross-sectional view, taken along the y-2 cross section;

FIG. 4C is a schematic, cross-sectional view thereof, taken along the x cross section;

FIG. 5A is a schematic, cross-sectional view showing the structure of FIG. 4A following partial removal of the spacer layer and formation of protective gate spacers;

FIG. 5B is a schematic, cross-sectional view thereof, taken along the y-2 cross section;

FIG. 5C is a schematic, cross-sectional view thereof, taken along the x cross section;

FIG. 6A is a schematic, cross-sectional view of the structure shown in FIG. 5A following further recessing of the organic planarization layer and removal of spacer material from sidewalls of the nanosheet stacks;

FIG. 6B is a schematic, cross-sectional view thereof, taken along the y-2 cross section, following exposure of the sacrificial layer;

FIG. 6C is a schematic, cross-sectional view thereof, taken along the x cross section;

FIG. 7A is a schematic, cross-sectional view of the structure shown in FIG. 6A following inner spacer formation;

FIG. 7B is a schematic, cross-sectional view thereof taken along the y-2 cross section;

FIG. 7C is a schematic, cross-sectional view thereof, taken along the x cross section;

FIG. 8A is a schematic, cross-sectional view of the structure shown in FIG. 7A following deposition of a further organic planarization layer and placeholder trench patterning;

FIG. 8B is a schematic, cross-sectional view thereof, taken along the y-2 cross section;

FIG. 8C is a schematic, cross-sectional view thereof, taken along the x cross section;

FIG. 9A is a schematic, cross-sectional view of the structure shown in FIG. 8A, taken along the y-1 cross section, following deposition and recessing of placeholder material;

FIG. 9B is a schematic, cross-sectional view thereof taken along the y-2 cross section;

FIG. 9C is a schematic, cross-sectional view thereof, taken along the x cross section;

FIG. 10A is a schematic, cross-sectional view of the structure shown in FIG. 9A following source/drain epitaxy and deposition of an interlevel dielectric layer;

FIG. 10B is a schematic, cross-sectional view thereof, taken along the y-2 cross section;

FIG. 10C is a schematic, cross-sectional view thereof taken along the x cross section;

FIG. 13A is a schematic, cross-sectional view of the structure shown in FIG. 12A following deposition and planarization of a capping layer;

FIG. 13B is a schematic, cross-sectional view thereof taken along the y-2 cross section;

FIG. 13C is a schematic, cross-sectional thereof taken along the x cross section;

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

The use of backside contacts may facilitate the manufacture and performance of integrated circuits, particularly those including relatively small elements and increased packing density. Gate-all-around (GAA) transistors such as nanosheet transistors and fin-like field effect transistors (FinFETs) are among the elements employed in high density, high performance applications.

Figure 1:
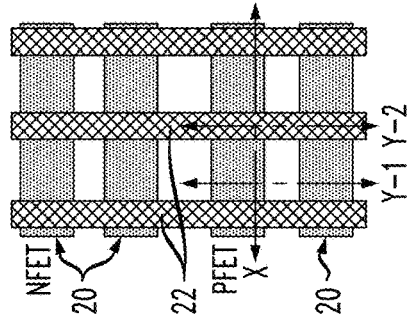
FIG. 1 is a top plan view of a layout including sacrificial gates over nanosheet stacks, showing x, y-1 and y-2 cross sections according to an exemplary embodiment.

An exemplary sequence of steps that may be employed for the fabrication of integrated circuits including backside contacts is shown in FIG. 1 and subsequent figures. The schematic top plan view of FIG. 1 provides perspective of the orientations of x, y-1 and y-2 cross sections with respect to fins comprising nanosheet stacks 20 and sacrificial gates 22 extending perpendicularly with respect to the fins. It will be appreciated that techniques as described herein are applicable to architectures including FinFETs as well as those including nanosheet transistors.

Figure 1B:
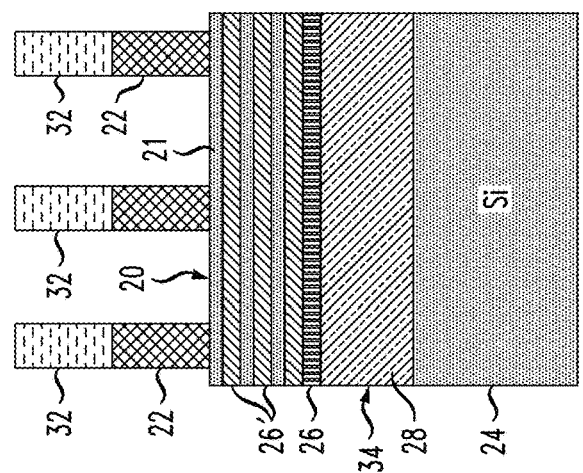
FIG. 1B is a schematic, cross-sectional view thereof taken along the y-2 cross section.
Figure 1A:
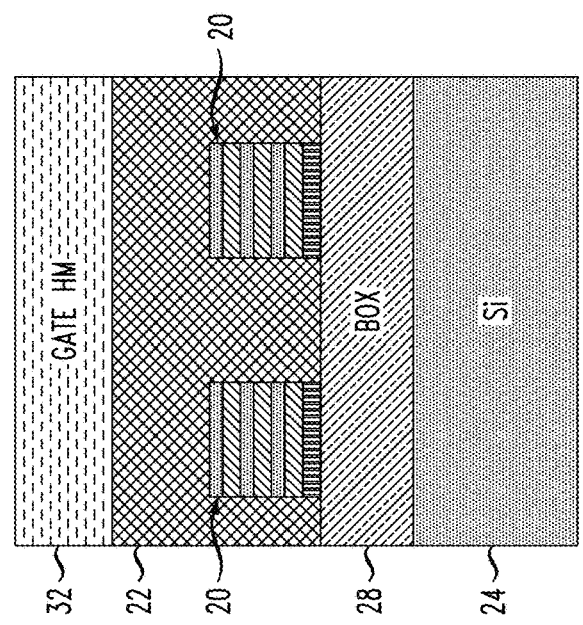
FIG. 1A is a schematic, cross-sectional view along the y-1 cross section of FIG. 1.
Figure 1C:
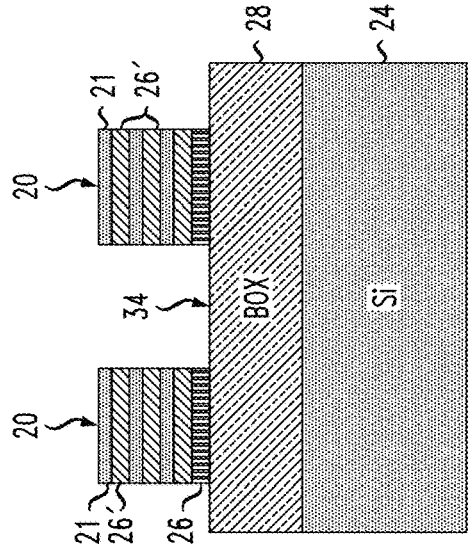
FIG. 1C is a schematic, cross-sectional view thereof taken along the x cross section.

The monolithic structure shown in FIG. 1, FIG. 1A, FIG. 1B and FIG. 1C include stacks 20 of nanosheets including semiconductor channel layers 21 formed over a substrate 34. The nanosheets can, for example, be formed on a semiconductor-on-insulator substrate. Referring to FIG. 1A, FIG. 1B and FIG. 1C, the substrate 34 includes a silicon layer 24, a silicon germanium top layer 26 having a relatively high germanium content, and a buried oxide (BOX) layer 28 between the silicon layer and the silicon germanium top layer 26.

In one or more exemplary embodiments, the semiconductor nanosheet (channel) layers 21 each have a thickness in the range of four to ten nanometers (4-10 nm). The number of semiconductor (channel) layers in the semiconductor layer stack may vary depending on the desired uses and capabilities of the nanosheet transistors to be fabricated. The semiconductor channel layers 21 are essentially monocrystalline silicon layers and are spaced ten to twenty nanometers (10-20 nm) apart in some embodiments. The width of each semiconductor channel layer 21 in the top, fin-like portions of the exemplary monolithic structure is fifteen nanometers (15 nm) or greater (as viewed in the y-1 and y-2 cross sections) some embodiments. The dimensions of the channel layers and the vertical spacing of channel layers should be considered exemplary as opposed to limiting.

Silicon and silicon germanium layers 21, 26', respectively, can be epitaxially grown on a semiconductor substrate in alternating sequence to obtain a layered stack having the desired number of silicon (channel) layers. The terms "epitaxially growing and/or depositing" and "epitaxially grown and/or deposited" mean the growth of a semiconductor material on a deposition surface of a semiconductor material in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

The monolithic structure illustrated in FIG. 1, FIG. 1A, FIG. 1B and FIG. 1C is obtained by first growing silicon and silicon germanium nanosheet layers in alternating sequence on the substrate 34. The sacrificial silicon germanium layers 26', which are replaced by metal gate and gate dielectric materials later in the process, may have a thickness in the range of six to twenty nanometers (6-20 nm). The dimension ranges of the channel layers and sacrificial silicon germanium layers should be considered exemplary as opposed to limiting. The silicon germanium layers 26' may have the composition $Si_{1-x}Ge_x$ where x is between 0.2 and 0.3 to allow selective etching with respect to silicon as well as the underlying silicon germanium top layer 26. In one exemplary embodiment, the sacrificial silicon germanium layers 26' have the composition $Si_{1-x}Ge_x$ where x is about 0.3 while the top substrate layer 26 has the composition $Si_{1-x}Ge_x$ where x is about 0.55. The thickness of the top silicon germanium substrate layer 26 may or may not be the same thickness as the sacrificial silicon germanium layers 26' that adjoin the silicon channel layers 21. Using a patterned hard mask (for example, silicon nitride), an initial reactive ion etch (RIE) is performed down to the BOX layer 28 to obtain a top multi-layer, fin-like semiconductor structure having a dielectric cap (not shown) formed from the hard mask. The multi-layer, fin-like semiconductor structures (nanosheet stacks 20) extend vertically from the substrate 34. The remaining portions of the hard mask are removed.

A sacrificial gate layer is formed over the stacks 20 of nanosheet layers and the BOX layer 28. The sacrificial gate layer may comprise, for example, amorphous silicon (a-Si) or polycrystalline silicon (polysilicon). Sacrificial gate material used to form the sacrificial gate layer may be formed using, for example, physical vapor deposition (PVD), chemical vapor deposition (CVD), plasma enhanced chemical vapor deposition (PECVD), inductively coupled plasma chemical vapor deposition (ICP CVD), or any combination thereof. A hard mask (for example, SiNx or a combination of SiNx and $SiO_2$)) is deposited and patterned on the top surface of the sacrificial gate layer. The sacrificial gate layer is then subjected to a reactive ion etch down to the BOX layer 28. The resulting structure includes sacrificial gates 22 that extend perpendicularly with respect to the parallel nanosheet stacks 20. The patterned gate hard mask 32 adjoins the top surfaces of the sacrificial gates. As shown in FIG. 1B, portions of the nanosheet stacks are embedded within the sacrificial gates. The sacrificial gates extend through both nFET and pFET regions of the exemplary structure, as illustrated in FIG. 1.

The top substrate layer 26 is selectively removed, thereby forming spaces 36 between the BOX layer 28 and the nanosheet stacks 20. As discussed above, the top substrate layer 26 has a higher germanium content than the sacrificial silicon germanium layers 26' within the nanosheet stacks 20 and can therefore be etched selectively with respect to such layers. A selective etching process such as dry HCl etch can be employed to remove the top substrate layer 26 selective to the silicon channel layers 21 as well as the sacrificial silicon germanium layers 26'. FIG. 2A, FIG. 2B and FIG. 2C provide sectional views of the resulting structure.

Figure 3C:
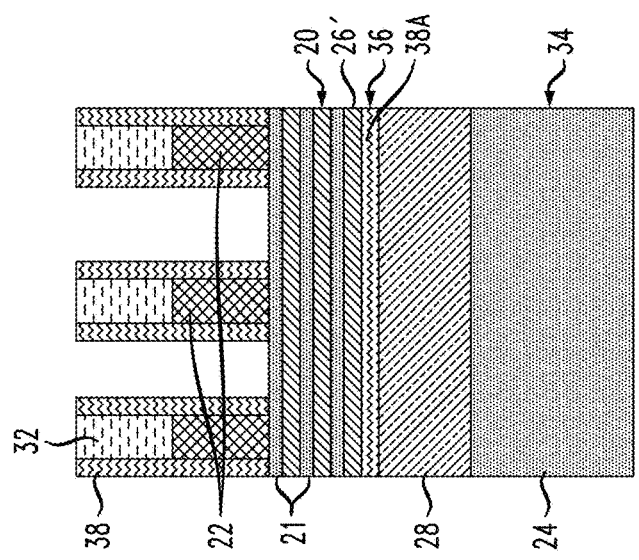
FIG. 3C is a schematic, cross-sectional view thereof, taken along the x cross section, of the structure shown in FIG. 3A.
Figure 3B:
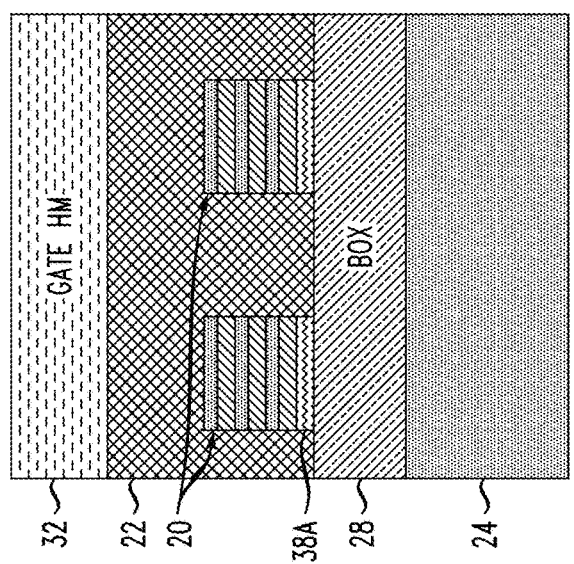
FIG. 3B is a schematic, cross-sectional view thereof, taken along the y-2 cross section, of the structure shown in FIG. 3A.
Figure 3A:
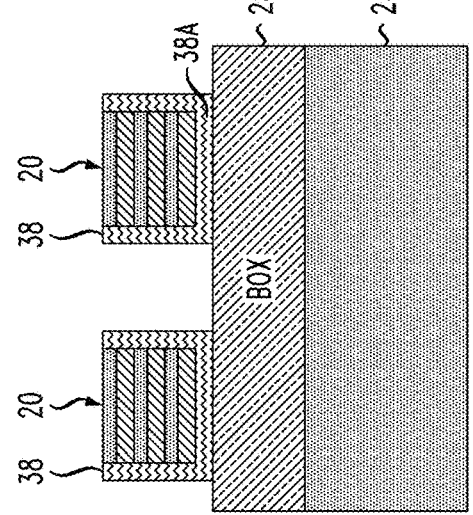
FIG. 3A is a schematic, cross-sectional view of the structure shown in FIG. 2A following formation of a spacer layer.

A dielectric layer is deposited over the resulting structure and fills the spaces 36 between the BOX layer 28 and the nanosheet stacks 20. Dielectric gate spacers may comprise, for example, SiN, SiBCN, SiOCN and/or SiCO, or other suitable dielectric materials. Such materials can be deposited using ALD (atomic layer deposition). In an exemplary embodiment, a silicon nitride liner is deposited on the monolithic structure. The silicon nitride liner is selectively etched back to remove unprotected horizontal portions thereof, thereby forming vertical, top sidewall gate spacers 38 on the sidewalls of the nanosheet stacks 20 and the sacrificial gates 22. The spacer material beneath the nanosheet stacks is protected and remains within the spaces 36 following etch-back, thereby forming a bottom dielectric isolation layer. FIG. 3A, FIG. 3B and FIG. 3C provide sectional views of the resulting structure including the vertical gate spacers 38 and the bottom dielectric isolation layer (horizontal spacers 38A) beneath the nanosheet stacks 20.

An organic planarization layer (OPL) 42 is deposited and then recessed to obtain a structure 40 as illustrated in FIG. 4A, FIG. 4B and FIG. 4C. As shown in the x cross section provided by FIG. 4C, portions of the hard mask 32 and vertical gate spacers 38 extend above the top surface of the OPL 42 following recessing of the OPL. The exposed portions of the gate spacers 38 are then selectively removed down to the level of the top surfaces of the OPL.

Referring to the structure 50 shown in the x cross section in FIG. 5C, gate protective sidewall spacers 44 are formed on the sidewalls of the top portions of the hard mask 32. Oxide sidewall spacers are formed in some embodiments. Aluminum oxide, titanium oxide and titanium nitride are among further alternative materials that may comprise the gate protective sidewall spacers 44 in embodiments wherein the vertical gate spacers 38 are silicon nitride spacers. The gate protective sidewall spacers 44 adjoin the top surfaces of the gate sidewall spacers 38 proximal to the sacrificial gates 22. As shown the y-1 cross section in FIG. 5A, the gate sidewall spacers 38 adjoining the nanosheet stacks 20 remain embedded within the OPL 42.

The OPL 42 is removed to expose the gate sidewall spacers 38 adjoining the nanosheet stacks 20. Ashing or other suitable process can be employed to remove the OPL. Unprotected portions of the gate sidewall spacers 38 are then removed to obtain a structure 60 as schematically illustrated in FIG. 6A, FIG. 6B and FIG. 6C. A reactive ion etch may be employed for such removal. The gate sidewall spacers 38 beneath the gate protective sidewall spacers 44 remain intact while those adjoining the nanosheet stacks are removed. The spacers 38A forming the bottom dielectric isolation layer beneath the nanosheet stacks 20 also remain intact.

Referring to FIGS. 7A, 7B and 7C, the portions of the nanosheet stacks 20 outside the regions protected by the sacrificial gate 22 and hard mask 32 are subjected to a reactive ion etch down to the horizontal spacers 38A. The resulting structure is subjected to a timed wet etching process to selectively recess the silicon germanium layers 26' within the nanosheet stacks 20. Hydrogen chloride gas is employed in some embodiments to selectively remove silicon germanium, leaving the silicon nanosheet (channel) layers 21 substantially intact. Alternatively, a wet etch process containing ammonia and hydroperoxide can be used to etch SiGe selective to other materials. Each exposed end of the silicon germanium layers 26' may be recessed by, for example, three to seven nanometers (3-7 nm). The silicon germanium layers 26' have smaller widths than the widths of the silicon (channel) layers 21 following the timed etch. The stack of semiconductor nanosheet layers accordingly includes indents between the end portions of each pair of silicon (channel) layers 21.

Dielectric spacer material is deposited in the trenches resulting from the reactive ion etch of the stack of semiconductor layers. The dielectric spacer material is etched back to form inner spacers 46 within each of the indents in the stack of nanosheet semiconductor layers. A selective wet etch may be employed to remove the dielectric inner spacer material outside of the indents between silicon layers. A structure 70 as schematically illustrated in FIGS. 7A, 7B and 7C may be obtained. The inner spacers 46 of the structure may comprise, for example, low-k dielectric material. Silicon oxynitride, SiBCN (silicon borocarbonitride), SiOCN (silicon oxycarbonitride), and/or SiOC (silicon oxycarbide) inner spacers may be formed in some embodiments. Relatively low-k silicon nitride-based materials, if used to form the inner spacers, can be selectively etched using, for example, phosphoric acid. Various techniques of forming inner spacers for nanosheet transistors have been discussed in the literature and continue to be developed. The particular materials and steps discussed with respect to inner spacer formation should accordingly be considered exemplary as opposed to limiting.

A further OPL 42' is deposited on the structure 70 and patterned using, for example, a lithographically patterned hard mask (not shown) formed thereon. As shown in FIGS. 8A and 8C, a placeholder trench 48 extending through the BOX layer 28 and partially within the semiconductor substrate layer 24 is formed. The sidewalls adjoining the placeholder trench are substantially vertical. Using the further OPL 42' as a mask, a reactive ion etch or sequence of reactive ion etches are employed to form the placeholder trench 48. End portions of the silicon nanosheet (channel) layers 21 on one side of the nanosheet stacks 20 are exposed upon formation of the placeholder trench 48, as shown in the x cross section in FIG. 8C. The opposite sides of the nanosheet stacks of the resulting structure 80 adjoin the further OPL 42'.

The further OPL 42' is removed and a placeholder material layer is deposited in the placeholder trench 48. The placeholder material layer is recessed to form a structure 90 as schematically illustrated in FIG. 9A, FIG. 9B and FIG. 9C. The placeholder material layer comprises sacrificial placeholders 52 that are later replaced by backside contacts, as described below. The sidewalls of the sacrificial placeholders are substantially vertical. Silicon germanium, aluminum oxide and titanium oxide are among the materials that may comprise the sacrificial placeholders 52.

Source/drain regions 56-1, 56-2 are epitaxially grown on the exposed edges of the silicon nanosheet channel layers 21. One of the source/drain regions 56-1 of each FET is grown over the one of the sacrificial placeholders 52. The source/drain region 56-2 grown on the opposite side of each FET is grown over the BOX layer 28, as shown in FIG. 10A and FIG. 10C. The widths of the sacrificial placeholders 52 are greater, respectively, than the widths of the source/drain regions 56-1 grown above them, as shown in the y-1 cross section (FIG. 10A). The epitaxial growth of the source/drain regions 56-1. 56-2 is timed to control height and width dimensions. Dopants may be incorporated in situ using appropriate precursors, as known in the art. By "in-situ" it is meant that the dopant that dictates the conductivity type of a doped layer is introduced during the process step, for example epitaxial deposition, that forms the doped layer. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contribute free electrons to an intrinsic semiconductor. In a silicon-containing substrate, examples of n-type dopants, i.e., impurities, include but are not limited to antimony, arsenic and phosphorous. Exemplary epitaxial growth processes that are suitable for use in forming silicon and/or silicon germanium epitaxy include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). With reference to FIG. 1, an nFET region(s) includes transistors having n-type source/drain regions while the pFET region(s) includes p-type source/drain regions. Source/drain regions of nanosheet devices are typically grown prior to the RMG process.

An interlevel dielectric (TLD) layer 58 is deposited over the source/drain regions using deposition techniques including, but not necessarily limited to, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), spin-on coating, sputtering, and/or plating. The ILD layer may include, but is not necessarily limited to, low-k materials (e.g., k less than about 4.0), such as, for example, porous silicates, carbon doped oxides, silicon dioxides, silicon oxynitrides, carbon-doped silicon oxide (SiCOH) and porous variants thereof, silsesquioxanes, siloxanes, or other dielectric materials having, for example, a dielectric constant in the range of about 2 to about 4. An SiCOH dielectric film having a dielectric constant (k) of about 2.7-2.8 can, for example, comprise one or more ILD layers. Such a dielectric film can be deposited using PECVD. ILD layers may, in some embodiments, comprise an ultra low-k (ULK) dielectric material having a dielectric constant of 2.5 or below. The ILD layer comprises multiple layers in some embodiments. The resulting structure is planarized using a CMP or other suitable technique, thereby removing excess ILD material and removing the hard mask 32. A structure 100 as schematically illustrated in FIG. 10A, FIG. 10B and FIG. 10C is obtained following CMP.

The sacrificial gate layer 22 is removed from the structure 100. The silicon germanium layers 26' are then selectively removed, leaving stacks of silicon (channel) layers 21 separated by spaces (not shown). Hydrogen chloride gas is employed in some embodiments to selectively remove silicon germanium, leaving silicon nanosheets substantially intact. Alternatively, a wet etch process containing ammonia and hydroperoxide can be used to etch SiGe selective to other materials. Gate stacks 62 are formed in adjoining relation to the nanosheet (channel) layers 21. A gate dielectric layer forms portions of the gate stacks that replace the sacrificial silicon germanium layers. The gate stacks adjoin the silicon nanosheet channel layers 21. Non-limiting examples of suitable materials for the gate dielectric layer include oxides, nitrides, oxynitrides, silicates (e.g., metal silicates), aluminates, titanates, nitrides, or any combination thereof. Examples of high-k gate dielectric materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The gate dielectric layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the gate dielectric material may vary depending on the deposition process as well as the composition and number of high-k dielectric materials used. In one exemplary embodiment, a high-k dielectric layer having a thickness of 2.5 nm is employed. In some embodiments, the gate dielectric layer includes multiple dielectric layers.

Electrically conductive gate material is deposited in the spaces formerly filled by the silicon germanium nanosheet layers 26'. The deposited metal gate material forms the metal gate of the nanosheet field-effect transistors of the resulting structure 110. In some embodiments, the electrically conductive gate includes a work function metal (WFM) layer. WFM serves dual purposes: Vt setting and gate conductor. Non-limiting examples of suitable work function metals include p-type work function metal materials and n-type work function metal materials. P-type work function materials include compositions such as ruthenium, palladium, platinum, cobalt, nickel, and conductive metal oxides, titanium nitride, or any combination thereof. N-type metal materials include, for example, hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, a conformal ALD process.

In one exemplary embodiment, an n-type WFM layer having a thickness of three nanometers (3 nm) may be formed on the gate dielectric layer. The thickness of the WFM layer may, for example, be in the range of two to ten nanometers (2-10 nm), with thinner layers being used as device scaling decreases. The n-type WFM layer is intended for use in association with the n-type transistors. Portions of the n-type WFM layer that may also be deposited in the pFET region may accordingly be replaced later in the process. The n-type WFM layer and the gate dielectric may fill the spaces between the silicon channel layers 21 and the regions formerly occupied by the sacrificial gates 22.

The n-type WFM layer in the nFET region may be protected by the patterned OPL (not shown). Exposed portions of the n-type WFM layer in the pFET region is removed, leaving open spaces between the silicon channel layers 21 within the pFET region. Gate metal is accordingly removed from the pFET region while the protected nFET region remains intact. An SC1 etch or other suitable etch processes can be employed to selectively remove gate metal while leaving the gate dielectric layer substantially intact. The duration of the etch, which is sufficient to allow removal of all gate metal from the pFET region, does not affect the gate metal in the nFET region. Following removal of the originally deposited n-type WFM layer from the pFET region, new gate metal deemed appropriate for the pFET transistors is deposited. A p-type WFM layer is deposited in embodiments wherein the first-deposited metal is n-type. It will be appreciated that the process can be reversed and n-type metal can be deposited subsequent to p-type metal in some alternative embodiments. Metal overburden can be removed using chemical mechanical planarization to complete front-end-of-line (FEOL) processing. An FEOL layer comprising FETs and possibly other electronic devices (not shown) within an ILD layer 58 is accordingly provided. Gate cut regions 67 (FIG. 11B) are also formed to separate the gates at cell boundaries.

Referring again to FIG. 11A, FIG. 11B and FIG. 11C, front side contacts are formed in middle-of-line (MOL) processing. Silicon-based devices typically include multiple interconnect metallization layers above a device (front-end-of-line/FEOL) layer that contains field-effect transistors (FETs) and/or other electronic structures. FEOL processing includes high-temperature steps for manipulating semiconductor conductivity. Middle-of-line (MOL) processing includes steps typically used for fabricating metal contacts for logic circuitry components such as field-effect transistors (FETs), resistors, diodes, and capacitors. MOL processing may include intermediate-temperature steps for forming semiconductor-metal compounds (for example, silicides, germanosilicides) for electrical contacts. Back-end-of-line (BEOL) processing involves the creation of metal interconnecting wires that connect the devices formed in FEOL processing to form electrical circuits and may include silicidation as discussed above with respect to MOL processing.

A first set of contacts 64-2 formed in the ILD layer 58 is electrically connected to source/drain regions 56-2. Metal gate contacts 66 formed during MOL processing are electrically connected to the gate stacks 62. Top (front side) source/drain contacts 64-2 and the gate contacts 66 can comprise electrically conductive material including, but not limited to, a silicide layer such as Ti, Ni, NiPt, and a metal adhesion layer, such as TiN, TaN and conductive metal fills, such as tungsten (W), aluminum (Al), copper (Cu), cobalt (Co), ruthenium (Ru), molybdenum (Mo), or any other suitable conductive material, and combinations thereof. A metal silicide layer can be formed on the source/drain regions 64-2 by depositing a metal liner such as a titanium liner thereon prior to deposition of the barrier and metal fill layers. Such a titanium liner can be deposited using physical vapor deposition (PVD), and is followed by annealing at a temperature between about two hundred and eight hundred degrees Centigrade to form the metal silicide.

The above-described FEOL processing provides a device layer 75 having a front side and a back side. The device layer includes FETs comprising channel regions (silicon nanosheet channel layers 21), source/drain regions 56-1, 56-2, and gate stacks 62, all of which are embedded within an ILD layer 58.

Metal interconnecting wires that connect the devices in the FEOL (device) layer 75, thereby forming electrical circuits, are formed within one or more BEOL interconnect layers 68 following MOL processing. The BEOL interconnect layers are formed over the front side of the device layer 75. The metal lines including the interconnecting wires are deposited in sequence (e.g., M1, M2, M3, etc.) over the FEOL layer and include dielectric layers. The interconnecting wires within each metal line are electrically connected to interconnecting wires in other metal lines and to the devices in the FEOL (device) layer 75. BEOL processing typically includes low-temperature steps for forming metal wires and preserving temperature sensitive FEOL and MOL structures. BEOL processing involves the formation of interconnect layers above the MOL layer(s). A chip may have multiple BEOL interconnect layers. Each interconnect layer, which has a wiring scheme, is connected to another interconnect layer by vias. The wires and vias are within dielectric layers, one or more of which may comprise low-k material.

Figure 11A:
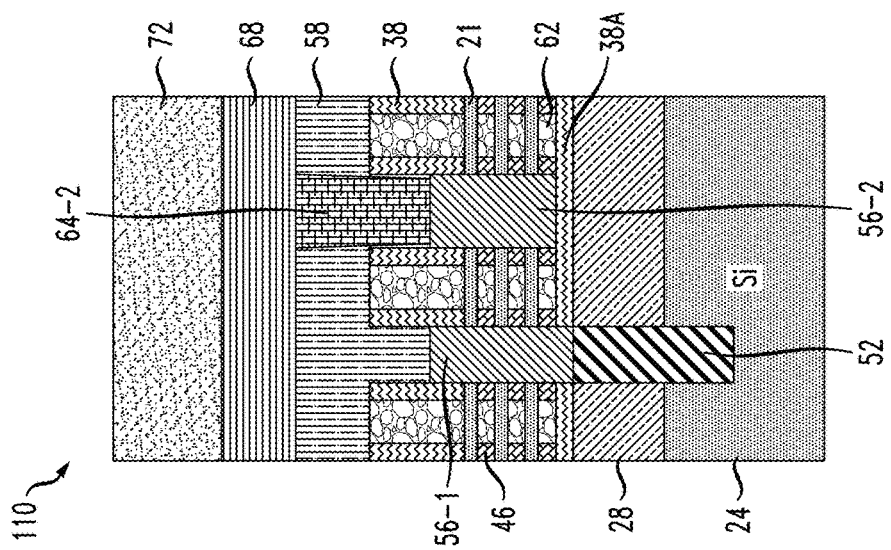
FIG. 11A is a schematic, cross-sectional view of the structure shown in FIG. 10A, following replacement gate formation, contact and interconnect formation, and carrier wafer bonding.
Figure 11B:
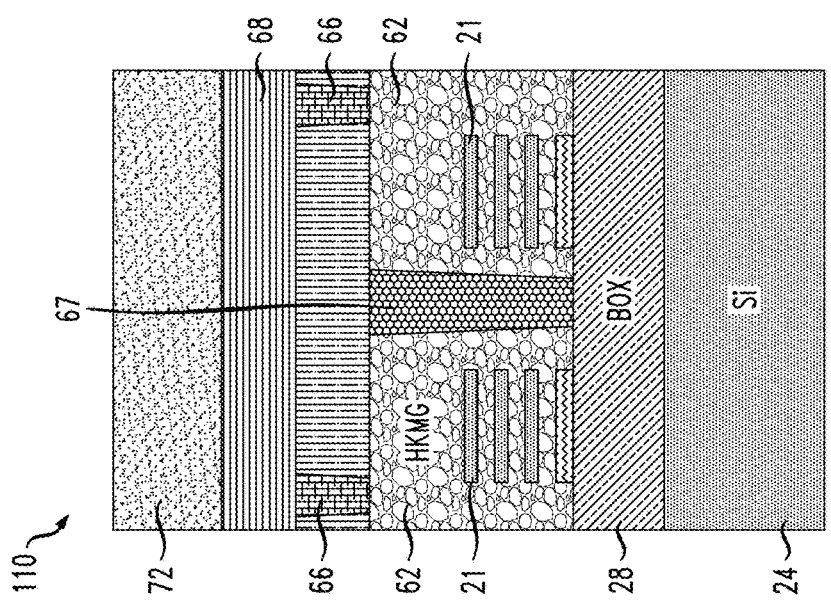
FIG. 11B is a schematic, cross-sectional view thereof taken along the y-2 cross section.
Figure 11C:
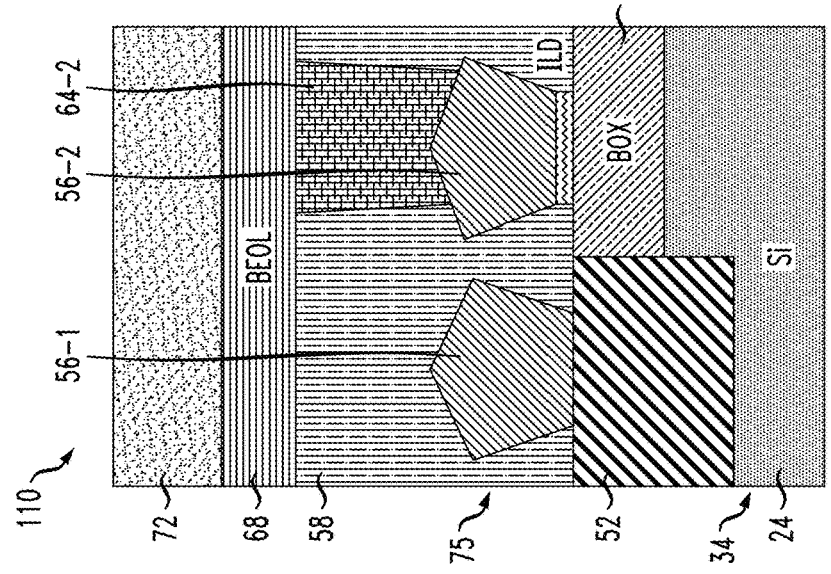
FIG. 11C is a schematic, cross-sectional view thereof taken along the x cross section.

A carrier wafer 72 is bonded to the resulting structure and adjoins the BEOL layer(s) 68. A monolithic structure 110 as shown in FIG. 11A, FIG. 11B and FIG. 11C includes an FEOL (device) layer 75 comprising nFET and pFET transistors, an MOL layer comprising front side contacts 64-2, 66, BEOL layer(s) 68 electrically connected to the devices in the device layer, and a carrier wafer 72.

Figure 12A:
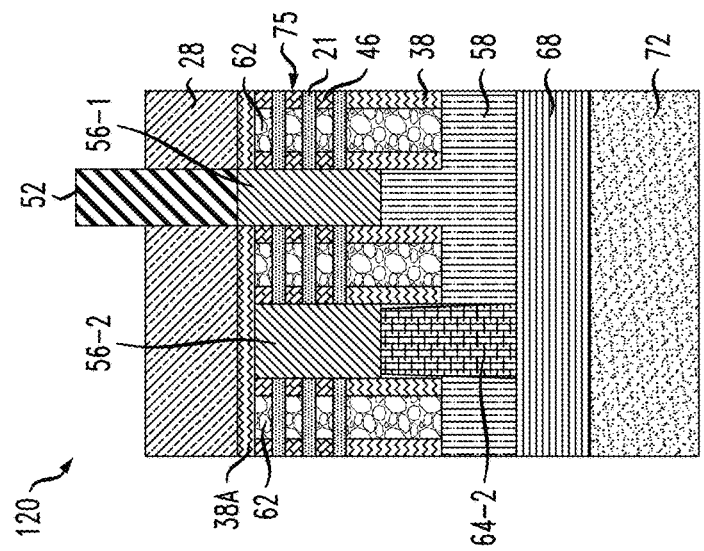
FIG. 12A is a schematic, cross-sectional view of the structure shown in FIG. 11A following wafer flip and removal of the semiconductor substrate.
Figure 12B:
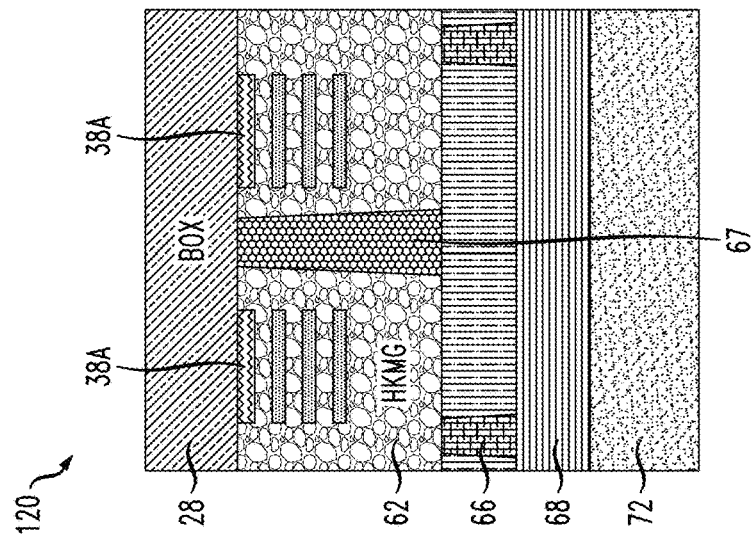
FIG. 12B is a schematic, cross-sectional view thereof taken along the y-2 cross section.
Figure 12C:
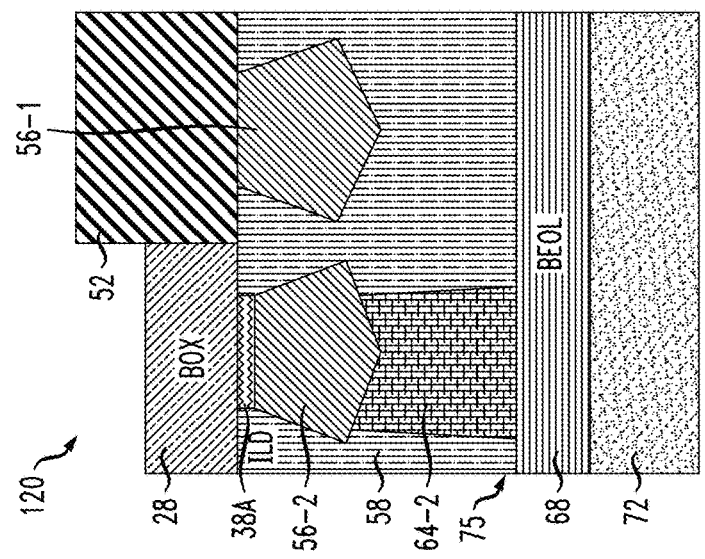
FIG. 12C is a schematic, cross-sectional view thereof taken along the x cross section.

The monolithic structure 110 is flipped and the silicon substrate layer 24 is removed therefrom. Ammonium hydroxide (NH$_4$OH) or tetramethylammonium hydroxide (TMAH) may be employed for such removal as their selectivity to silicon germanium is high. (As indicated above, the sacrificial placeholders 52 may comprise silicon germanium.) A monolithic structure 120 as schematically illustrated in FIG. 12A, FIG. 12B and FIG. 12C may be obtained.

Figure 14A:
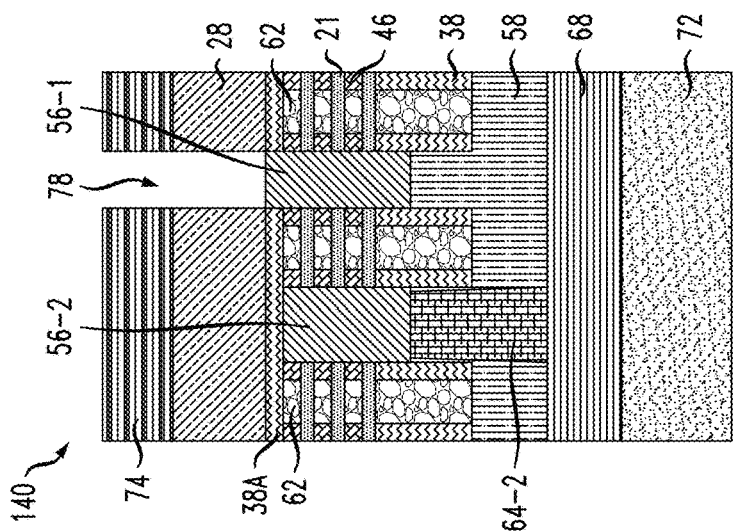
FIG. 14A is a schematic, cross-sectional view of the structure shown in FIG. 13A following selective removal of the sacrificial placeholder.
Figure 14B:
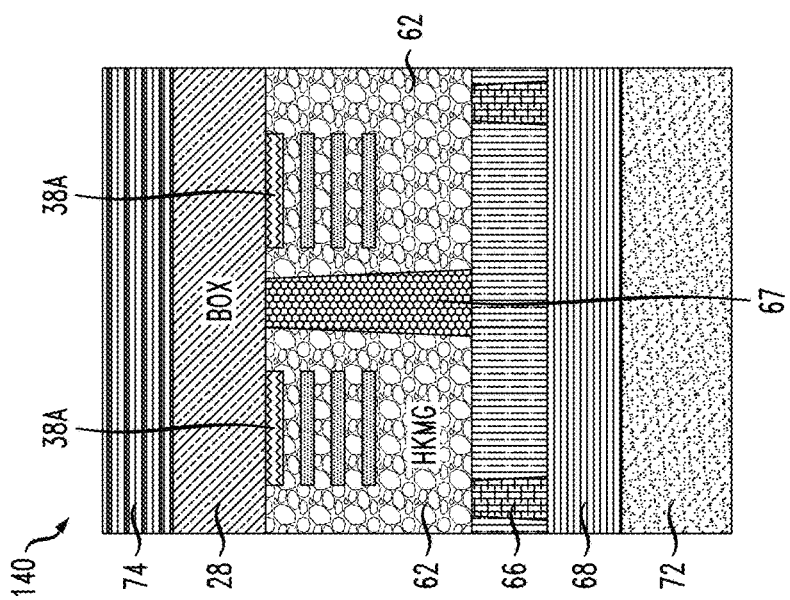
FIG. 14B is a schematic, cross-sectional view of the structure shown in FIG. 14A taken along the y-2 cross section.
Figure 14C:
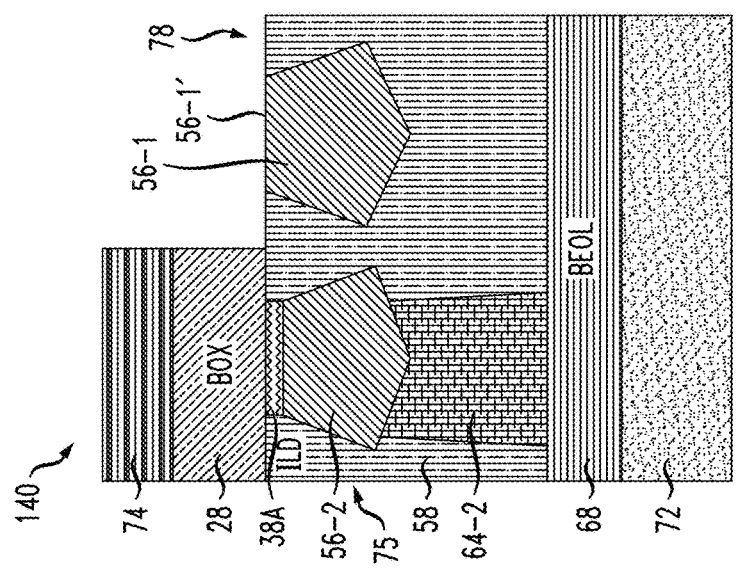
FIG. 14C is a schematic, cross-sectional view thereof taken along the x cross section.

A dielectric capping layer 74 is deposited on the backside of the structure 120 and planarized down to the top surface of the sacrificial placeholders 52. A silicon nitride capping layer is employed in some embodiments. A structure 130 as schematically illustrated in FIG. 13A, FIG. 13B and FIG. 13C may accordingly be obtained. The sacrificial placeholders 52 are then selectively removed. Cavities 78 are formed above the source/drain regions 56-1, thereby exposing the bottom, backside-oriented surfaces 56-1' thereof. The widths of the cavities 78 exceed, respectively, the widths of the bottom surfaces 56-1' of the adjoining source/drain regions 56-1 as viewed in the y-1 cross section (FIG. 14A) and accordingly expose portions of the ILD layer 58 on both sides of the source/drain regions 56-1. FIG. 14A, FIG. 14B and FIG. 14C illustrate an exemplary structure 140 that may be obtained following removal of the sacrificial placeholders.

Figure 15A:
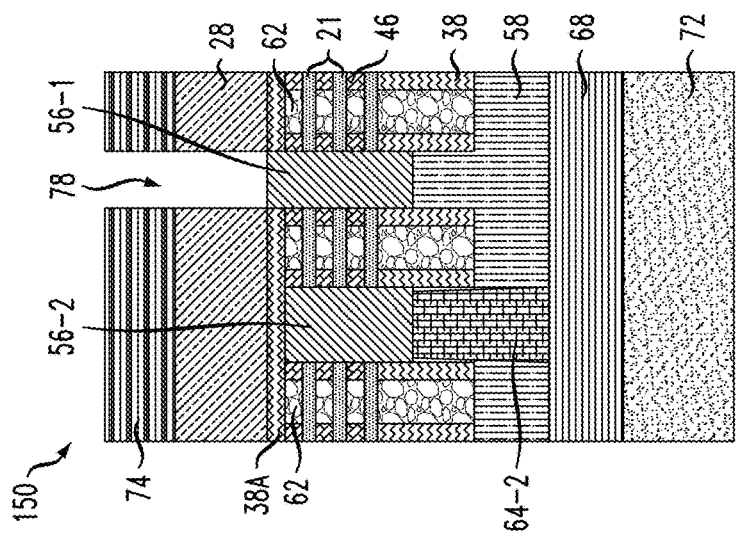
FIG. 15A is a schematic, cross-sectional view of the structure shown in FIG. 14A following exposure of selected source/drain regions.
Figure 15B:
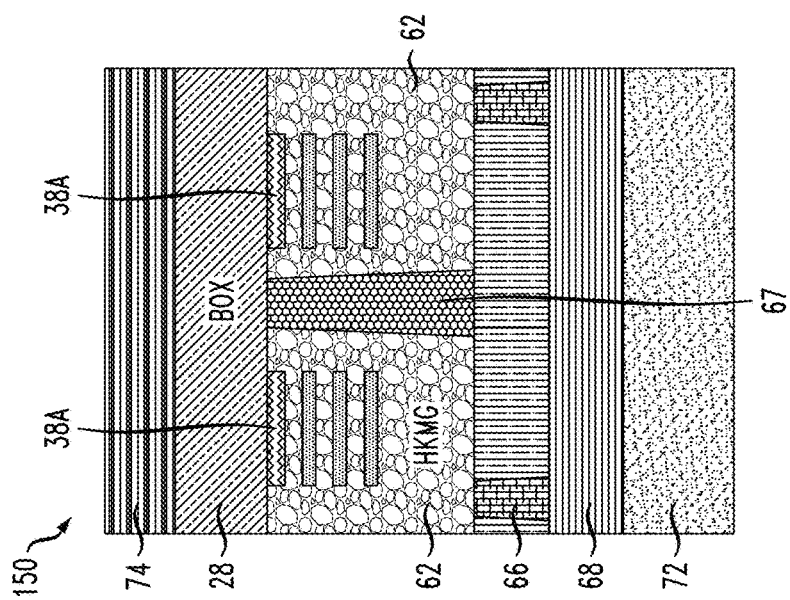
FIG. 15B is a schematic, cross-sectional view thereof taken along the y-2 cross section.
Figure 15C:
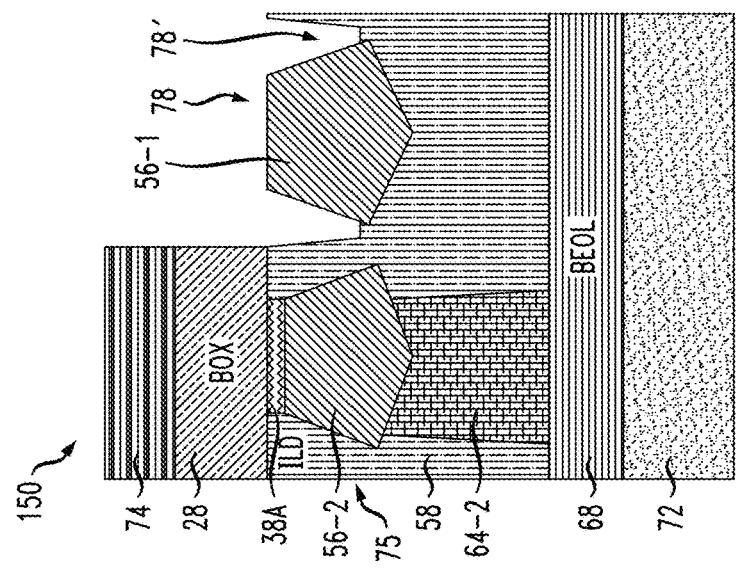
FIG. 15C is a schematic, cross-sectional view thereof taken along the x cross section.

The cavities 78 are extended within the ILD layer 58 to expose the sidewalls of the source/drain regions 56-1. A dry etch (for example, a reactive ion etch) may be employed to form cavity extensions 78'. The etching selectively removes a portion of the ILD layer 58 without etching the capping layer 74. The etch can be timed such that the cavity extensions 78' do not extend as deeply as the source/drain regions 56-1 within the ILD layer 58. The cavities 78 and cavity extensions 78' form recesses that expose the bottom surface (now top-facing) and sidewalls of the source/drain regions 56-1. Relatively large areas of the source/drain regions 56-1 are exposed for later processing. An exemplary structure 150 as shown in FIG. 15A, FIG. 15B and FIG. 15C can be obtained.

Figure 16A:
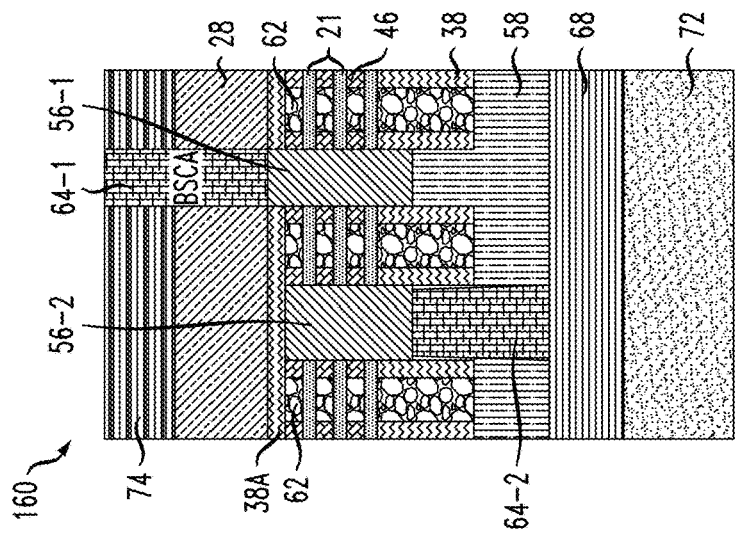
FIG. 16A is a schematic, cross-sectional view of the structure shown in FIG. 15A following backside contact metallization.
Figure 16B:
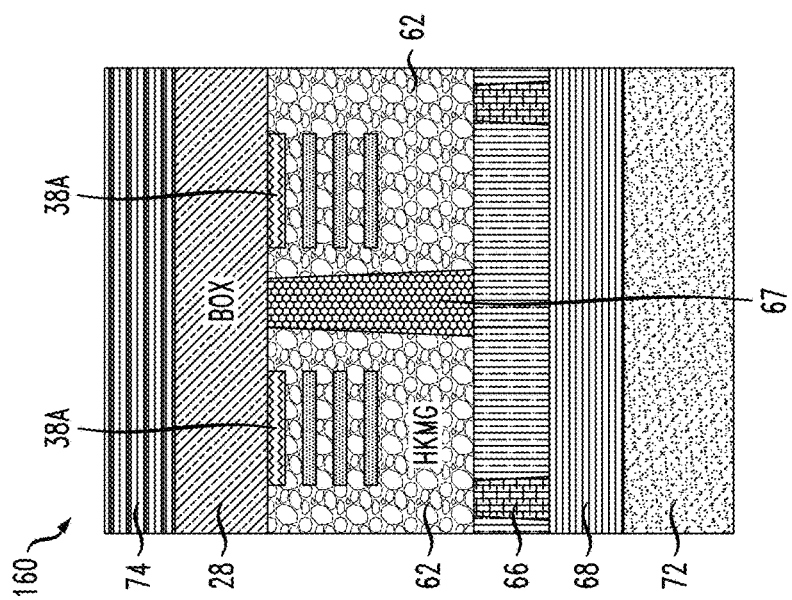
FIG. 16B is a schematic, cross-sectional view thereof taken along the y-2 cross section.
Figure 16C:
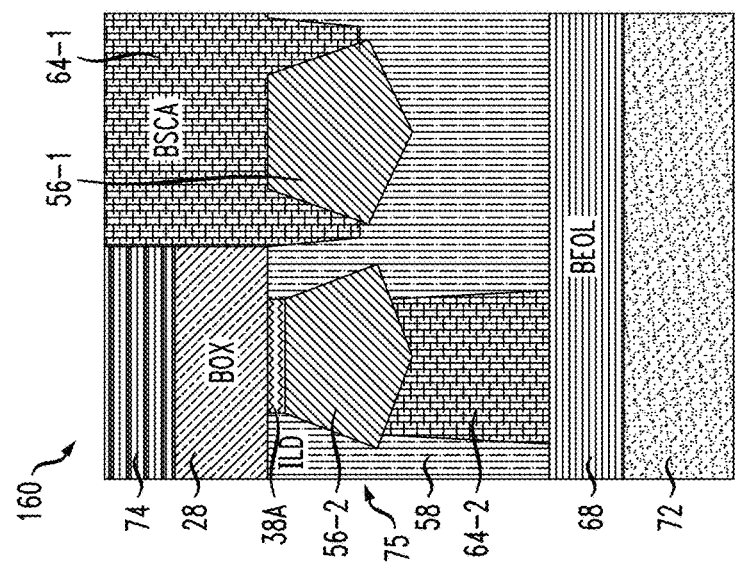
FIG. 16C is a schematic, cross-sectional view thereof taken along the x cross section.

Backside contact metallization and metal overburden removal are performed to obtain a structure 160 as schematically illustrated in FIG. 16A, FIG. 16B and FIG. 16C. Backside source/drain contacts 64-1 may or may not comprise the same metal(s)/metal silicide(s) used to form the front side source/drain contacts 64-2. The existence of the BEOL layer 68 at this stage of the process may preclude a high temperature thermal anneal. The relatively large contact areas between the source/drain regions 56-1 and the backside source/drain contacts 64-1 helps mitigate possible contact resistance issues arising from the absence of a high temperature thermal anneal during the backside metallization process. Each backside source/drain contact 64-1 has a larger width than the width CD of the bottom surface (the "bottom" surface now being at the top following wafer flip) of the corresponding source/drain region 56-1, as shown in the y-1 cross section in FIG. 16A. The backside source/drain contacts 64-1 extend within the ILD layer 58 deposited over the source/drain regions 56-1, 56-2 during the FEOL processing stage. Portions of the backside source/drain contacts 64-1 are accordingly positioned between the ILD layer 58 and the sidewalls of the source/drain regions 56-1.

Figure 17A:
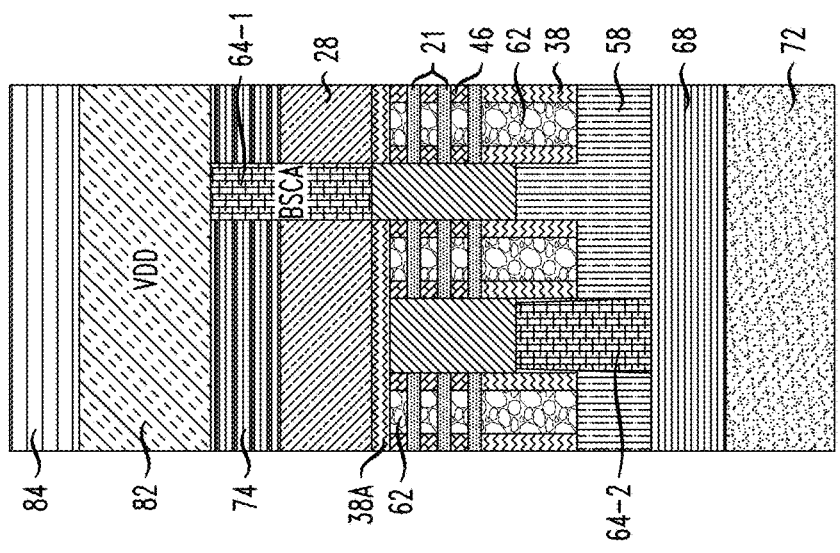
FIG. 17A is a schematic, cross-sectional view of the structure shown in FIG. 16A following the formation of backside power rails and a backside power delivery network (BS-PDN)
Figure 17B:
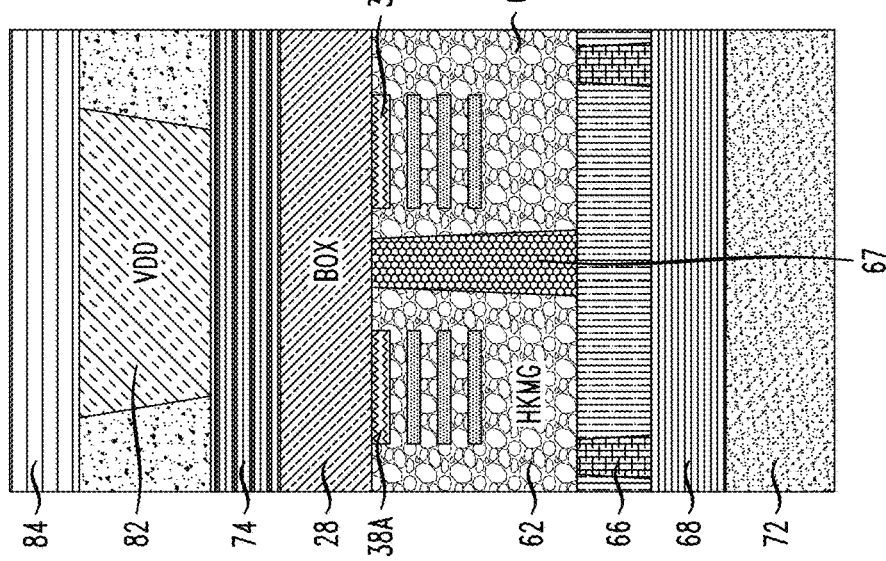
FIG. 17B is a schematic, cross-sectional view thereof taken along the y-2 cross section.
Figure 17C:
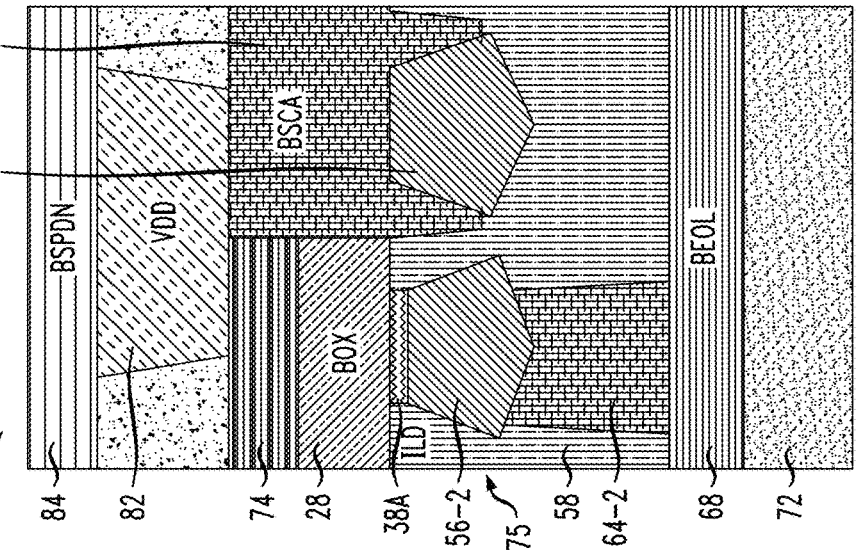
FIG. 17C is a schematic, cross-sectional view thereof taken along the x cross section.

A backside power rail 82 and a backside power delivery network (BSPDN) 84 are formed over the capping layer 74. The backside power rail is electrically connected to one or more of the backside source/drain contacts 64-1. A monolithic structure 170 as schematically illustrated in FIG. 17A, FIG. 17B and FIG. 17C can accordingly be obtained.

The monolithic structure 170 includes a device layer having a front side and a back side. The device layer includes an interlevel dielectric layer 58, field-effect transistors, and optionally further electronic devices. The field-effect transistors include channel regions including stacked semiconductor nanosheet layers 21 in the exemplary embodiment. First and second source/drain regions 56-1, 56-2 extend laterally from each channel region. A back-end-of-line layer 68 is positioned over the front side of the device layer and is electrically connected to the field-effect transistors. A backside contact 64-1 having a greater width than a bottom surface of the first source/drain region 56-1 extends from the back side of the device layer, the backside contact being electrically connected to the first source/drain region 56-1 and contacting first and second sidewall surfaces of the first source/drain region 56-1. A front side contact 64-2 connects the second source/drain region 56-2 to the BEOL layer 68. A first portion of the backside contact 64-1 extends between the interlevel dielectric layer 58 and the first sidewall surface of the first source/drain region 56-1 and a second portion of the backside contact extends between the interlevel dielectric layer 58 and the second sidewall surface of the first source/drain region 56-1, as shown in FIG. 17A. A relatively large contact area is accordingly formed between the backside contact 64-1 and the first source/drain region. The backside contact is electrically connected to a power rail (e.g., a VDD rail), which is in turn electrically connected to the BSPDN 84.

The drawing figures as discussed above depict exemplary processing steps/stages in the fabrication of exemplary structures. Although the overall fabrication methods and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example James D. Plummer et al., *Silicon VLSI Technology: Fundamentals, Practice, and Modeling* 1*st* *Edition*, Prentice Hall, 2001, which is hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having, for example, FET devices and contacts formed in accordance with one or more of the exemplary embodiments.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this invention. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments may be referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment (s) shown. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" and "vertical" are used to indicate relative positioning of elements or structures to each other as opposed to relative elevation. If a layer of a structure is described herein as "over" another layer, it will be understood that there may or may not be intermediate elements or layers between the two specified layers. If a layer is described as "directly on" another layer, direct contact of the two layers is indicated.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b). It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus, the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A monolithic semiconductor structure, comprising:
    a device layer having a front side and a back side, the device layer comprising:
        an interlevel dielectric layer; and
        a field-effect transistor, the field-effect transistor including a channel region and first and second source/drain regions within the interlevel dielectric layer, the first and second source/drain regions extending laterally from the channel region;
    a back-end-of-line interconnect layer over the front side of the device layer;
    a power rail over the back side of the device layer;
    an oxide layer on the back side of the device layer and a dielectric capping layer on the oxide layer, the oxide layer and the dielectric capping layer sandwiched between the interlayer dielectric layer and the power rail; and
    a backside contact having a greater width than a bottom surface of the first source/drain region and extending from the back side of the device layer, through the oxide layer and the dielectric capping layer, the backside contact being electrically connected to the first source/drain region and contacting first and second sidewall surfaces of the first source/drain region.

2. The monolithic semiconductor structure of claim 1, wherein a first portion of the backside contact extends between the interlevel dielectric layer and the first sidewall surface of the first source/drain region and a second portion of the backside contact extends between the interlevel dielectric layer and the second sidewall surface of the first source/drain region.

3. The monolithic semiconductor structure of claim 2, further including a front side contact electrically connecting the second source/drain region and the back-end-of-line interconnect layer.

4. The monolithic semiconductor structure of claim 3, wherein the power rail over the back side of the device layer is electrically connected to the backside contact.

5. The monolithic semiconductor structure of claim 3, wherein the channel region comprises a stack of nanosheet semiconductor layers.

6. The monolithic semiconductor structure of claim 5, wherein the front side contact extends through the interlevel dielectric layer and electrically connects a front surface of the second source/drain region to the back-end-of-line interconnect layer.

7. The monolithic semiconductor structure of claim 6, wherein the field-effect transistor further includes gate metal, further including a gate contact electrically connecting the gate metal to the back-end-of-line interconnect layer.

8. A monolithic semiconductor structure, comprising:
    a device layer including a front side and a back side, the device layer comprising:
        an nFET region comprising nFET transistors;
        a pFET region comprising pFET transistors; and
        an interlevel dielectric layer, the nFET transistors and the pFET transistors being positioned within the interlevel dielectric layer;
    a back-end-of-line interconnect layer over the front side of the device layer, the back-end-of-line interconnect layer being electrically connected to one or more of the nFET transistors and the pFET transistors;
    one or more power rails over the back side of the device layer;
    an oxide layer on the back side of the device layer and a dielectric capping layer on the oxide layer, the oxide layer and the dielectric capping layer sandwiched between the interlayer dielectric layer and the one or more power rails; and
    one or more backside contacts extending from the back side of the device layer, through the oxide layer and the dielectric capping layer, each of the one or more backside contacts being electrically connected, respectively, to a first source/drain region of one of the nFET transistors and the pFET transistors, each of the one or more backside contacts having a greater width than a bottom surface of the first source/drain region and contacting first and second sidewall surfaces of the first source/drain region.

9. The monolithic semiconductor structure of claim 8, wherein a first portion of each backside contact extends, respectively, between the interlevel dielectric layer and the first sidewall surface of the first source/drain region of one of the nFET transistors and the pFET transistors, and a second portion of each backside contact extends between the interlevel dielectric layer and the second sidewall surface of the first source/drain region of one of the nFET transistors and the pFET transistors.

10. The monolithic semiconductor structure of claim 9, further including front side contacts electrically connecting a plurality of the nFET transistors and the pFET transistors with the back-end-of-line interconnect layer.

11. The monolithic semiconductor structure of claim 10, wherein the one or more power rails over the back side of the device layer are electrically connected to the one or more backside contacts.

12. The monolithic semiconductor structure of claim 10, wherein each of the nFET transistors and the pFET transistors comprises a channel region including a stack of nanosheet semiconductor layers.

13. The monolithic semiconductor structure of claim 12, further including a plurality of front side contacts extending through the interlevel dielectric layer and electrically connecting one or more of the nFET transistors and the pFET transistors to the back-end-of-line layer.

14. The monolithic semiconductor structure of claim 13, wherein each of the nFET transistors and pFET transistors includes gate metal, further including gate contacts electrically connecting the gate metal to the back-end-of-line layer.

15. A method of fabricating a semiconductor structure including a backside contact, comprising:
  forming an oxide layer on the back side of the device layer;
  forming a sacrificial placeholder within a substrate and the oxide layer;
  forming a device layer having a front side and a back side over the substrate, the device layer including an interlevel dielectric layer, a semiconductor channel region, and first and second source/drain regions within the interlevel dielectric layer and extending laterally from the semiconductor channel region, the first source/drain region and portions of the interlevel dielectric layer adjoining the first source/drain region being formed directly above the sacrificial placeholder;
  forming a back-end-of-line interconnect layer over the front side of the device layer;
  forming a dielectric capping layer on the oxide layer;
  removing the sacrificial placeholder, thereby exposing a bottom surface of the first source/drain region and the portions of the interlevel dielectric layer adjoining the first source/drain region;
  forming recesses in the interlevel dielectric layer, thereby exposing a first sidewall and a second sidewall of the first source/drain region;
  forming a backside contact over the bottom surface, the first sidewall, and the second sidewall of the first source/drain region and extending from the back side of the device layer, through the oxide layer and the dielectric capping layer; and
  forming a backside power rail over the back side of the device layer, wherein the oxide layer and the dielectric capping layer are sandwiched between the interlayer dielectric layer and the backside power rail.

16. The method of claim 15, wherein the substrate comprises a semiconductor layer, further including:
  removing the semiconductor substrate;
  wherein removing the sacrificial placeholder forms a cavity extending through the oxide layer, the cavity having a greater width than the bottom surface of the first source/drain region.

17. The method of claim 15, further including:
  bonding a carrier wafer to the back-end-of-line interconnect layer prior to removing the semiconductor substrate.

18. The method of claim 15, further including:
  forming a gate stack within the device layer, the gate stack adjoining the channel region.

19. The method of claim 15, wherein the channel region comprises a stack of nanosheet semiconductor layers.

20. The method of claim 15, wherein the backside power rail is electrically connected to the backside contact.

* * * * *